(12) United States Patent
Walser et al.

(10) Patent No.: US 11,859,976 B2
(45) Date of Patent: Jan. 2, 2024

(54) AUTOMATIC LOCATING OF TARGET MARKS

(71) Applicant: HEXAGON TECHNOLOGY CENTER GMBH, Heerbrugg (CH)

(72) Inventors: Andreas Walser, St.Gallen (CH); Simon Bestler, Langenargen (DE)

(73) Assignee: HEXAGON TECHNOLOGY CENTER GMBH, Heerbrugg (CH)

( * ) Notice: Subject to any disclaimer, the term of this patent is extended or adjusted under 35 U.S.C. 154(b) by 0 days.

(21) Appl. No.: 17/940,894

(22) Filed: Sep. 8, 2022

(65) Prior Publication Data
US 2023/0003524 A1 Jan. 5, 2023

Related U.S. Application Data

(62) Division of application No. 16/868,162, filed on May 6, 2020, now Pat. No. 11,733,043.

(30) Foreign Application Priority Data

May 6, 2019 (EP) ..................................... 19172787
May 6, 2019 (EP) ..................................... 19172793

(51) Int. Cl.
*G01C 15/00* (2006.01)
*G06T 7/66* (2017.01)
(Continued)

(52) U.S. Cl.
CPC ............. *G01C 15/006* (2013.01); *G01C 1/04* (2013.01); *G01C 3/08* (2013.01); *G01S 17/66* (2013.01); *G06T 7/66* (2017.01); *H01L 31/107* (2013.01)

(58) Field of Classification Search
CPC ......... G01C 15/006; G06T 7/66; G01S 17/66; H01L 31/107
(Continued)

(56) References Cited

U.S. PATENT DOCUMENTS 6,031,606 A 2/2000 Bayer et al.
8,772,719 B2 7/2014 Bockem et al.
(Continued)

FOREIGN PATENT DOCUMENTS

CH 676042 A5 11/1990
EP 0 815 468 B1 2/2002
(Continued)

OTHER PUBLICATIONS

Extended European Search Report dated Nov. 18, 2019 as received in Application No. 19172793.2.
(Continued)

*Primary Examiner* — Jeffery A Williams
(74) *Attorney, Agent, or Firm* — Maschoff Brennan

(57) ABSTRACT

A target reflector search device. This device comprises an emitting unit for emitting an emission fan, a motorized device for moving the emission fan over a spatial region, and a receiving unit for reflected portions of the emission fan within a fan-shaped acquisition region, and a locating unit for determining a location of the reflection. An optoelectronic detector of the receiving unit is formed as a position-resolving optoelectronic detector having a linear arrangement of a plurality of pixels, each formed as an SPAD array, and the receiving unit comprises an optical system having an imaging fixed-focus optical unit, wherein the optical system and the optoelectronic detector are arranged and configured in such a way that portions of the optical radiation reflected from a point in the acquisition region are expanded on the sensitivity surface of the optoelectronic detector in such a way that blurry imaging takes place.

14 Claims, 10 Drawing Sheets

(51) Int. Cl.
*G01S 17/66* (2006.01)
*H01L 31/10* (2006.01)
*G01C 1/04* (2006.01)
*G01C 3/08* (2006.01)
*H01L 31/107* (2006.01)

(58) Field of Classification Search
USPC ........................................................ 356/4.01
See application file for complete search history.

(56) References Cited

U.S. PATENT DOCUMENTS

| | | |
|---|---|---|
| 9,087,936 B2 | 7/2015 | Sun et al. |
| 10,508,914 B2 | 12/2019 | Torok et al. |
| 2008/0004808 A1 | 1/2008 | Johnson et al. |
| 2012/0327271 A1 | 12/2012 | Nordenfelt |
| 2013/0099346 A1 | 4/2013 | Choong et al. |
| 2016/0005913 A1 | 1/2016 | O'Neill et al. |
| 2016/0181293 A1 | 6/2016 | Mcgarvey et al. |
| 2016/0258752 A1 | 9/2016 | Hornung |
| 2017/0122734 A1 | 5/2017 | Nordenfelt et al. |
| 2017/0242136 A1 | 8/2017 | O'Neill et al. |
| 2018/0172834 A1 | 6/2018 | Kolb |
| 2019/0196017 A1* | 6/2019 | Stutz .................... G01S 7/4861 |

FOREIGN PATENT DOCUMENTS

| | | |
|---|---|---|
| EP | 1 329 691 A2 | 7/2003 |
| EP | 1 422 499 A2 | 5/2004 |
| EP | 1 876 416 A2 | 1/2008 |
| EP | 3 199 913 A1 | 8/2017 |
| EP | 3 330 741 A1 | 6/2018 |
| EP | 3 336 576 A1 | 6/2018 |
| WO | 2005/059473 A2 | 6/2005 |
| WO | 2010/148525 A1 | 12/2010 |
| WO | 2011/098131 A1 | 8/2011 |
| WO | 2014/180487 A1 | 11/2014 |

OTHER PUBLICATIONS

European Search Report dated Oct. 29, 2019 as received in Application No. 19172787.4.

* cited by examiner

50
Emitting an emission fan of optical radiation, preferably pulsed

51
Moving the emission fan in different directions over a spatial region to be scanned

52
Receiving a reflection of the emission fan in a fan-shaped reception region using a projection of the reception region on a position-resolving optical detector having a linear arrangement of multiple pixels each formed as SPAD arrays, performed by an imaging optical unit, which is performed using a blurry image, expanded in relation to a focused image, of the reflection on the position-resolving optical detector

53
Determining a position of the reflection on the basis of the direction of the emission fan in the spatial region and analyzing of the position-resolving optical detector, wherein the position is produced using a determination of a location of an intensity focal point of the blurry image of the reflection over a plurality of the pixels

Fig. 9

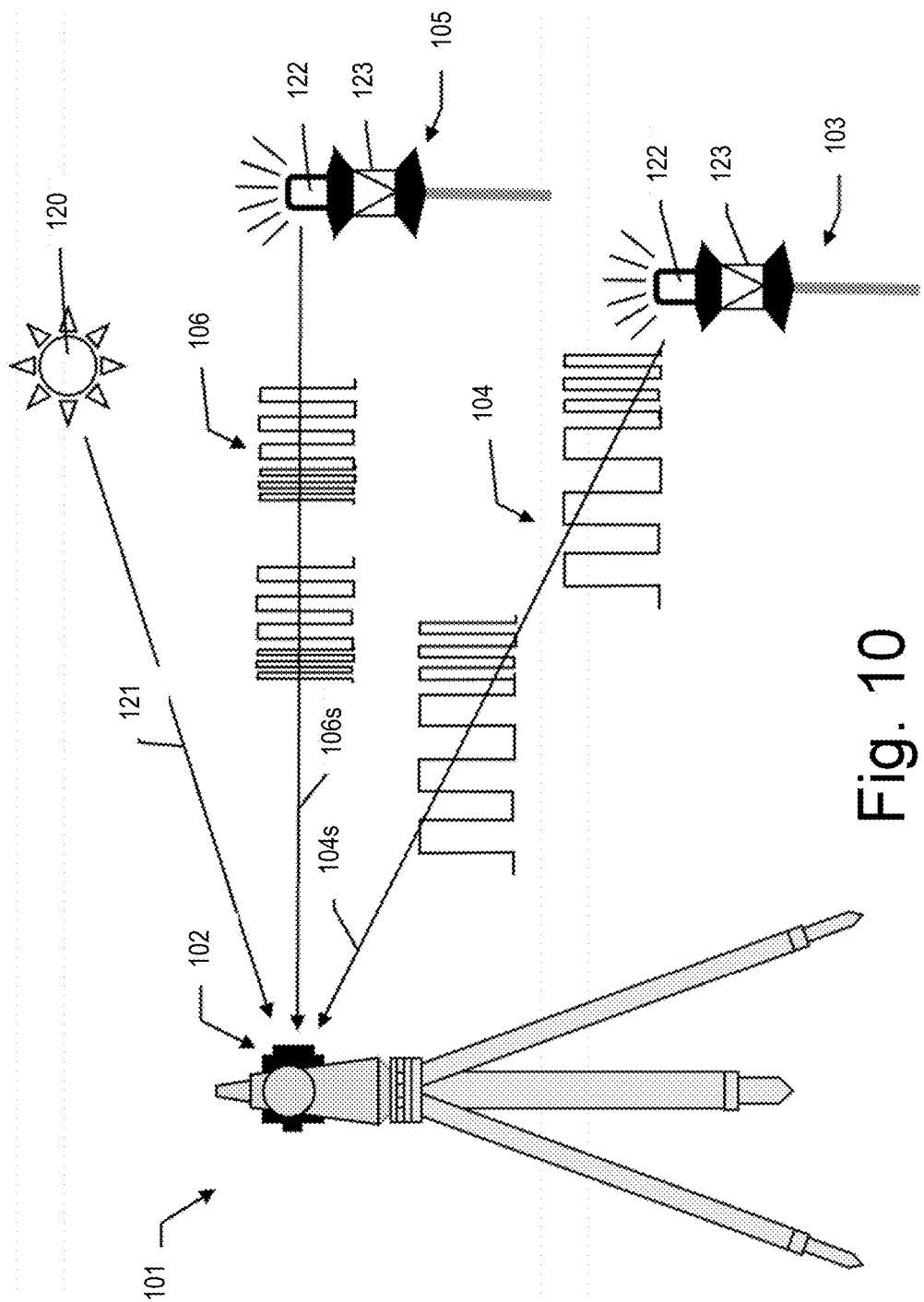

AUTOMATIC LOCATING OF TARGET MARKS

CROSS-REFERENCE TO RELATED APPLICATIONS

This application claims priority to European Patent Application No. 19172793.2, filed on May 6, 2019 and European Patent Application No. 19172787.4, filed on May 6, 2019. The foregoing patent applications are herein incorporated by reference.

FIELD OF THE INVENTION

The present invention generally relates to automatic locating of target marks. A first aspect of the invention, which is described hereinafter, relates to a target reflector search device and a method for automatic target acquisition, and especially also to a surveying device, which is designed for automatically locating reflective target marks. A second aspect of the invention which is described further below relates to a method and a device for automatic image-based location of a target marker.

BRIEF SUMMARY OF THE INVENTION

The first aspect of some aspects of the present invention relates to automatic locating of reflective target marks for a surveying device by means of an optical-electronic device. Such automatic target locators, also referred to as ATR (Automatic Target Recognition) or Power Search are known, for example, from CH 676042, EP 1 329 691, U.S. Pat. No. 6,031,606, EP 1 422 499, or EP 1 876 416. These target reflector search devices automatically scan their surroundings using a searchlight fan for retroreflective objects, which can then be automatically targeted as a result by the surveying device for exact geodetic surveying.

It is a problem of the first aspect of some embodiments of the present invention to improve such a target reflector search device, a target finder, or a target acquisition unit— especially in a surveying device, for example, a total station, but also in a theodolite, tachymeter, laser scanner, laser tracker, laser leveler, or similarly constructed devices.

A faster and/or more accurate acquisition of reflective targets can especially be sought out in this case, in particular wherein a distance to the target is also to be ascertained in addition to a two-dimensional direction. The possibilities for differentiating spurious reflections and actual measurement targets are also to be further improved and automated as much as possible in this case.

These problems are solved according to some aspects of the invention by the features of the independent claims and/or these solutions are refined by the features of the dependent claims.

In this case, a light fan is emitted by the target finder, which can be formed as a separate unit or can be integrated into a surveying device. For example, a light line or laser line aligned in a first direction, which extends over a predetermined angle range and is preferably continuous or at least essentially continuous, is emitted, preferably essentially along a straight line. This emission of the light fan can be performed here, for example, using a corresponding beamforming, imaging refractive, catadioptric, or diffractive optical unit, which forms the emitted light (for example, from one single or from multiple semiconductor light sources such as LEDs or lasers) into a line, are formed. Alternatively, the emission of the light fan can also be performed using a scanning movement of a deflecting element. In addition to a continuous emission, a time-pulsed emission of the light can also be performed here.

This light fan is movable in this case in a second direction, which does not coincide with the first direction, for example, essentially or substantially orthogonally to a longitudinal direction of the light fan. In one embodiment, the light fan can be rotated or pivoted here in the second direction by an angle range, preferably by up to 360°. For example, in this case the light source and/or its optical unit can be moved, or a deflection unit for the emitted light (for example, a mirror or a prism) can be moved. A solid angle range can thus be scanned using the light fan, for example, a conical or pyramidal solid angle range or an (often symmetrical) spherical zone. During the movement of the light fan, a current location of the movement can be acquired or measured in this case using an encoder or another sensor unit, in particular at least in the second direction.

In one embodiment of a surveying device designed like a theodolite in its geometry (for example, a total station or a laser scanner), the emitting unit for the light fan can be arranged here in such a way that the light fan is rotatable with the surveying device—especially around the standing axis.

Thus, for example, the emitting unit can be arranged in the upper structure, the alidade (i.e., for example, on the base or in one of the supports), or also on or in the telescope body or telescope, so that the light fan is moved with this part of the surveying device. The light fan can optionally also be movable around the tilt axis—for example, if it is emitted on or in the telescope. In one special embodiment, the light fan can also be emitted essentially coaxially through the telescope, for example. A direction of the emitted light fan can be determined in this case using the angle encoders of the corresponding theodolite axes.

If at least a part of the emitted light fan is incident on a reflective and/or retroreflective object, at least a part of the emitted light is thus reflected and can be detected using a receiving unit of the target finder. The receiving unit comprises in this case a receiving optical unit and an optoelectronic detector, and can be formed, for example, coaxial or biaxial in relation to the emitting unit in this case. A field of view of the receiving optical unit is configured or formed here in such a way that it coincides with the emitted light fan or covers it—at least essentially or also exactly. For example, this can be performed using an optical system having a corresponding arrangement and formation of optical components, such as lenses, screens, diffractive structures, etc.

The optoelectronic detector is position-resolving in this case and is especially arranged and configured or formed in such a way that a position resolution can be carried out using it within the light fan, i.e., for example, along the projected laser line along the first direction.

Upon movement of the light fan over a spatial region, an analysis unit can thus ascertain a location of a reflecting target within this scanned spatial region in the first direction on the basis of the location resolution and in the second direction on the basis of an associated direction of the movement.

In one embodiment, the light fan can also be used to ascertain at least a rough distance to the reflecting target. Exact surveying of the distance with geodetic accuracy, i.e., surveying with the full measurement accuracy of the actual surveying device, is not important in this case. However, a distance can be ascertained at least roughly—in relation to the measurement accuracy of the surveying device, i.e., for example, approximately at an accuracy in the range of centimeters—by means of the target reflector search device. For example, this can be performed using an analysis of a runtime of the light from the target acquisition unit to the reflecting target and back. For example, the light fan is emitted in the form of amplitude-modulated or time-interval-modulated light pulses and a time difference is ascertained between the emission of the light fan pulse and the reception of a reflected portion or component of the light fan pulse, whereby a distance value is ascertained from this runtime on the basis of the of the propagation speed of the light. To carry out such a determination of the distance, the receiving unit is designed accordingly to be able to acquire such runtimes in the range of nanoseconds or less.

In order to be able to cover the spatial region with sufficiently high resolution using a family of light fans during rapid movement of the light fan in the second direction, a corresponding rapid analysis of the receiving unit is to be endeavored. Moreover, the analysis of the optoelectronic detector in the first direction has to be able to be carried out with a sufficiently high position resolution to also be able to cover the first direction with a resolution sufficient for this purpose. Multiple reflections can also certainly occur in practice within one of the light fans simultaneously, which are to be recognized accordingly and separated as much as possible by the analysis unit. These requirements—especially when considered together—can only be fulfilled inadequately using conventional CCD or CMOS sensors or also PSDs as optoelectronic detectors.

The first aspect of some aspects of the present invention especially relates to a target reflector search device, which is designed for automatic locating of at least one (in particular retro-) reflective target mark by a geodetic surveying device. This device comprises in this case an emitting unit, which emits optical radiation in the form of an emission fan oriented in a first direction to illuminate the target mark. This emission fan can preferably be formed as a plane in this case, so that the projection in the search space is formed linear, especially as a straight line, and, for example, having an opening angle of approximately +/−5 to +/−20° in the first fan direction and is formed orthogonally thereto as a preferably collimated light line having an opening angle at least less than +/−1°, preferably narrower than +/−0.05°. In one embodiment, in the case of a positioned total station as a surveying device, the alignment of the emission fan can be, for example, essentially parallel to the standing axis (i.e., in regular operation essentially vertical) and can in particular extend over an angle range of, for example, approximately +/−20° in relation to a horizontal direction.

Furthermore, a motorized device is provided for moving the emission fan along a second direction. This can be configured or formed as a dedicated part of the device or also as part of the surveying device. It is designed to move the emission fan over a spatial region along the second direction and to acquire a value of the second direction. The second direction does not coincide with the first direction in this case and is preferably oriented essentially orthogonally to the first direction. For example, in the above-mentioned total station, the movement can be formed as a rotation over an angle range around a vertically oriented standing axis, thus preferably, for example, a substantially horizontal pivot of the emission fan over the spatial region to be acquired, especially by up to 360°.

The device according to some aspects of the invention also comprise a receiving unit in this case, which receives reflected portions or components of the optical radiation of the emission fan as reflections using an optoelectronic detector. The reflections from the reflective target mark are to be acquired especially in this case—in practice, however, often unfortunately not only these but rather also undesired interfering reflections from other reflectively acting objects in the spatial region are received. This reception takes place in this case within a fan-shaped acquisition region, which is also referred to as a reception fan. The reception region is moved along with the emission fan in this case and can be formed in such a way that it essentially corresponds to the alignment and dimensions of the emission fan or comprises it.

The device moreover comprises a locating unit, which determines a position of the reflection using an analysis of the receiving unit and on the basis of the values of the second direction. This position in the spatial region can especially be provided in this case as coordinates in a coordinate system of the target reflector search device or in the coordinate system of the surveying device, for example, as a location of the target reflector in the first and second directions, in the above example thus, for example, in the form of a horizontal location and a vertical location of the target reflector.

According to the first aspect of some aspects of the present invention, in this case the optoelectronic detector is designed as a position-resolving optoelectronic detector having a linear arrangement of multiple photosensitive pixels or sensor elements. The pixels are each formed in this case as SPAD (Single Photon Avalanche Photodiodes) array acquisition units, which are each formed per pixel having multiple Single Photon Avalanche Photodiodes (SPADs) operated in the Geiger mode and interconnected to form a common output signal. Such SPADs are also referred to as MPPC (Multi Pixel Photon Counter) or SPM (Semiconductor Photomultiplier) or in general as Semiconductor Photomultiplier and are described, for example, in function and exemplary embodiments, inter alia in US 2016/0005913, US 2017/0242136, US 2016/0181293, US 2013/0099346, WO 2014/180487, and U.S. Pat. No. 9,087,936.

The detector comprises in this case a preferably linear juxtaposition of at least more than at least two such pixels, which can be formed as individual components or jointly as a monolithic component. According to the invention, however, one hundred or more pixels are not used in this case, but rather a comparatively small number of pixels, for example, in relation to classic CCD lines or cameras, i.e., for example, approximately fewer than 33 pixels, preferably fewer than 17 pixels, especially, for example, approximately 5 to 16 pixels. The sensitivity surfaces of these pixels are preferably at least approximately continuously juxtaposed in the linear arrangement in this case, i.e., for example, having a distance between the sensitivity surfaces of the pixels of less than 20% of the sensitivity surface dimension in the linear direction, preferably of less than 10% or even less, down to a distance of zero or approximately zero. In one exemplary embodiment, a pixel formed as an SPAD array can be formed with respect to the order of magnitude as an at least approximately square pixel having approximately 1 mm edge length. During the analysis thereof, an amplifier stage, especially a TIA, can usually be omitted in relation to conventional APDs. A higher bandwidth, in particular in the range >1 GHz, is also implementable in comparison to CMOS-based or CCD-based systems. Therefore, inter alia, the SNR may be improved and/or a better suppression of ambient light may be achieved, for example, of sunlight on a construction site. In comparison to classic photosensors, very high amplitude dynamics may also be achieved by nonlinear compression of the signal. In contrast to an integrated signal of a CMOS or CCD sensor, a SiPM supplies a direct time signal in real-time and enables a picosecond resolution of a received light pulse, which is also advantageous, for example, for a precise distance measurement.

The multiple individual single photon avalanche photodiodes of a pixel formed as an SPAD array are interconnected in this case to form a single output signal per pixel. For example, the photodiodes can each be provided with a series resistor and these series circuits can then be connected in parallel to form one pixel output signal.

The receiving unit also comprises an optical system having an imaging fixed-focus optical unit, for example, having at least one optical lens or lens group. In one embodiment, for example, using an imaging single lens, the entire object space of the fan-shaped reception region can be imaged in an image space or in an image plane.

The optical system and the optoelectronic detector are arranged and formed in this case in such a way that portions or components of the optical radiation reflected from the acquisition region are expanded on the sensitivity surface of the optoelectronic detector in such a way that blurry imaging takes place. The arrangement and design of the optical system and the detector are thus embodied according to the invention in such a way that light from one point in the acquisition region, differing from optimum focusing, is incident on a non-minimal surface region on the detector. Expressed in reverse, an acquisition region imaged in the object space of one of the pixels is formed in this case in such a way that it partially overlaps with the acquisition region of an adjacent pixel.

In an alternative embodiment, the receiving optical unit can be designed in such a way that a diffuser plate is arranged in the image plane or focal plane, for example, as a thin microlens array or hologram having high transmission. In this case, the sensitivity surface of the optoelectronic detector can be located directly behind the diffuser plate. This arrangement of the optical system and the detector can especially be designed according to the invention in this case in such a way that light from a point in the acquisition region is sharply imaged in the focal plane, but occupies a certain surface region on the detection surface of the optoelectronic detector, which is larger than the sharp imaging. In other words, the edge zones of the acquisition regions of two adjacent pixels thus partially overlap. In this way, for example, advantages can be provided with respect to controlling background light, reducing or preventing an edge drop of the brightness, and/or avoiding virtual intermediate imaging of the sensor surface in the object space.

The position of the reflection in the first direction is thus determined using an analysis of the optoelectronic detector and on the basis of the associated, in particular chronologically associated, second direction. The determined position can then be provided to the surveying device, which as a result can exactly target this position using its telescope or laser target axis and can survey it in a known manner.

The optical system can be formed in this case in one embodiment having a detector offset to the front or rear by a defined offset in relation to a focal plane of the imaging optical unit. In particular, the pixels can thus be arranged defocused in this case in relation to the focus or focal point of the optical unit. Especially, for example, the imaging optical unit and the pixels can be formed and arranged in such a way that light from one point from an object space located in front of the imaging optical unit illuminates a surface on the SPAD array line located behind the imaging optical unit, wherein this surface is intentionally larger than the minimal circle of confusion caused by the quality of the optical system. In particular, in one embodiment, this surface can be at least approximately equal to or larger than a sensitivity surface of one of the pixels. In other words, the photosensitive region of the linear detector can be arranged defocused in such a way that incident electromagnetic radiation is distributed essentially homogeneously over a coherent sensitivity region of the pixels.

In a further embodiment, a microlens array can be arranged in or somewhat in front of the focal plane of the wide-angle receiving optical unit of the receiving unit. This microlens array is formed having a number of cylindrical rod lenses continuously abutting one another, which expand the acquisition region in a defined manner in the direction of the laser fan. The pixels of the SPAD array line are placed behind this astigmatic microlens array viewed from the object space. A received light bundle of the receiving objective, which is imaging as such, is thus slightly expanded in the first direction immediately before the detection surface of the SPAD array line. The light from one point from the object space located in front of the imaging optical unit thus illuminates an elliptical surface on the SPAD array line located behind the imaging optical unit. In this case, this surface is intentionally designed as larger than the circle of confusion of the point transfer function of the imaging receiving objective.

In one embodiment, the optical system of the receiving unit can in this case comprise a single slit aperture, which delimits the image field on the fan-shaped acquisition region, between the imaging optical unit and the detector. In one embodiment, in this case this is especially a slit aperture defining a field of view, in which the gap is sufficiently wide that an angle range of at least the width of the aperture angle of the emission light fan can be seen in the first fan direction, i.e., a type of field aperture or field-of-view aperture. In this case, the optical system can also comprise a preferably narrowband spectral filter, which is primarily transmissive to a specific wavelength of the light emitted by the target illuminator (for example, in the infrared range). In another embodiment, the slit aperture can also be designed in this case in such a way that a diffraction at the gap (or the gaps) of the slit aperture is utilized for the spectral separation of a specific wavelength of target illuminator light on the detector.

For example, the optical unit can be formed and arranged in this case in such a way that focusing of an object space of the imaging optical unit takes place in (or at least essentially on a region around) a plane of the slit aperture, and the pixels are arranged defocused at a defined distance behind the plane of the slit aperture—i.e., in the so-called back focus. In this case, in particular the defined distance can be selected in such a way that a circle of confusion of the defocusing essentially corresponds to a width of the pixels orthogonal to the pixel row arrangement (and/or the aperture slit direction or fan direction), or the defined distance can be selected in such a way that a circle of confusion due to the defocusing essentially corresponds to a height of one of the pixels in the pixel row arrangement (and/or the fan direction or aperture slit direction).

The optical system can additionally or alternatively also be formed having an optical diffuser element between the imaging optical unit and the detector. Such a diffuser element can especially be in this case a diffusely light-transmissive optical component, for example, formed as a spreading disk or matte disk, as opal glass or milky transition glass, as a cylindrical microlens array, but also a structured spreading disk having light guide structure or a holographic spreading plate.

In one embodiment, the formation and arrangement of the optical system and the detector can be carried out in such a way that the reflected component of the optical radiation from one point from the fan-shaped reception region is received by more than one of the pixels, in particular is always received by more than one of the pixels. The intentionally blurry imaging of the point on the detector thus causes expansion of the point on the detector, so that light from this point—especially if the imaged point comes to rest in a region of the transition between two pixels on the detector—is acquired by more than one of the pixels. In one embodiment, the design can especially be performed in such a way, for example, that light of the point which does not go beyond half of one pixel of the detector is also at least partially always received by an adjacent pixel. In this case, an individual or common optical diffuser can be provided in front of each of the pixels, which, even in the case of an only partially illuminated pixel, distributes the light essentially over the entire sensitivity surface of the pixel—i.e., over the multiple photodiodes of the SPAD array of the pixel—preferably at least approximately homogeneously.

In other words, the position-resolving optoelectronic detector can comprise an optical, practically loss-free beam expander in this case, which is formed and arranged in such a way that the reflected electromagnetic radiation from an object space point illuminates a surface on the sensor element, in particular wherein the optical unit is formed having a beam expander in front of each of the pixels.

Observed in the reverse direction, a region or sector of the acquisition region associated with one of the pixels (i.e., the region of the object space from which light emitted there is detectable by this pixel) can be formed at least partially overlapping with that of an adjacent pixel, preferably, for example, overlapping by approximately 5% to 50%.

In one embodiment of the invention, in this case the analysis of the locating unit can be formed in such a way that a position in the first direction—i.e., along the fan-shaped acquisition region—is produced using an interpolated analysis, which is ascertained in dependence on a reception intensity, of the electrical output signals of multiple pixels. For example, using a reception intensity-barycenter formation (or centroid or center of gravity of the intensity) based on the output signals of a plurality of the pixels, or using averaging according to a mathematical function, for example, linear averaging, of an intermediate position between two pixels on the basis of a signal strength at the pixel outputs thereof. The locating unit is thus especially formed in this case so as to ascertain a position resolution in the first direction which exceeds the number of the pixels, so that more positions are resolved along the reception fans than pixels are provided. In this case, for example, a first reception intensity from a first pixel and a second reception intensity from a second pixel located adjacent can be ascertained. The ascertainment can preferably run in parallel for all of the pixels in this case, i.e., for example, having an individual electronic reception channel in each case for each of the pixels, which are analyzed in parallel and not sequentially. In this case, especially one item of information about the point in time of the incidence of a reception light pulse, and also one item of information about the intensity of the reception light pulse, can be ascertained per pixel. A distance of the reflector can be ascertained in this case on the basis of the point in time via a time-of-flight (TOF) analysis. With sufficiently different points in time for the adjacent first and second pixels, it can be assumed that they originate from different reflection sources staggered in the distance and are therefore not to be considered to be coherent. In the case of identical or at least essentially identical point in time at first and second pixels, it can be assumed that this involves the same reflection from the same reflector. A coherent observation can thus be performed, in which weighting is performed on the basis of the reception intensity at the first and second pixels, on the basis of which a location of the reflection, especially the center of the reflection, between the optical axes of the beam path of the first and second pixels is ascertained as the position of the reflection. This can also be performed similarly in the case of two adjacent pixels in the second direction (having an observation of the points in time in each case in relation to the emission of the associated emission fan pulse), whereby a location of the reflection in the second direction between the adjacent emission fans can also be ascertained. It is also possible to similarly expand over more than two illuminated pixels and/or emission fans arranged in succession.

In one embodiment, the locating unit can also be formed in this case in such a way that the analysis in the second direction is performed with a barycenter formation or average value formation dependent on the reception intensity based on the output signals of the individual pixels with adjacent values of the second direction. A position resolution can thus be ascertained in the second direction which exceeds the number of the acquired second directions, so that more positions are resolved along the second direction along the movement of the reception fan than reception fan pulses were emitted—i.e., for example, also a second direction associated with the reflection, which is located between the second directions in which the light fan pulses were emitted or from which they were received, respectively. To also still be able to reliably locate small reflector marks at long distances, the object space has to be scanned as continuously as possible. In one embodiment for covering such cases, the light fans are to have a certain minimum width (or a minimum aperture angle) in the second direction in this case, or alternatively in the case of narrow light fans, a sufficiently tight scanning density of the object space is required, wherein the scanning density is primarily determined by the pulse rate of the emission fan and the speed of the movement in the first direction, and/or the pulse rate has to be selected to be correspondingly high to achieve a desired scanning speed. For example, typical surveying reflectors appear very small in the angle at long distances from the instrument, for example, in the order of magnitude of approximately 0.0035°. So as not to miss such small targets, the emission unit has to acquire the object space in the second direction preferably continuously or at least with a resolution in the above-mentioned magnitude. The emission fans are therefore accordingly emitted at emission rates of several kilohertz, for example, 50 kHz or greater.

In one embodiment of the invention, the locating unit can be formed having a distance measuring unit which ascertains at least one distance measured value for each of the pixels and/or for each reflection, in particular using a runtime measurement or phase measurement of pulses of the emitted optical radiation of the emission fan. Both runtime measurement and also phase measurement can be measured, for example, by means of the waveform digitization technology known to a person skilled in the art. In this case, a distance can be ascertained in particular for a reflection of the optical radiation and can be provided as part of the position. In addition, the reflectance can be derived from the measured signal amplitude and distance as a characteristic parameter of the reflecting target object. In any case, a depth in the distance direction can also be ascertained in this case on the basis of a chronological duration of a reflection and/or pulse expansion of the received reflection. In this regard, the SPADs used in the pixels according to the invention can provide advantages with the reception characteristics thereof, especially with regard to the time, sensitivity, and overload behavior thereof. In the case of SPAD arrays, for example, the high electrical signal bandwidth thereof of 1 to 2 GHz is particularly advantageous, using which a time resolution in the picosecond range is achievable, and also the robustness thereof against overload, for example, in sunlight.

In one embodiment, the locating unit can be designed in such a way that an extension in the first direction is ascertained as a height and/or an extension in the second direction is ascertained as a width of a respective spatially coherent reflection, which is provided as an item of information about a dimension or spatial extension of the reflector and/or the potential target mark as additional information for the position. In this case, for example, the position can be provided as the barycenter, centroid or center point of the reflection (especially the received light intensity barycenter or the center point of the area of the reflection resulting with height and width) and its height and width. The area of the reflection can also be ascertained in this case having an inclination in relation to the first and second direction, for example, having a height and/or width and also an associated inclination in relation to the first or second direction—for example, of an oblong reflector strip, which is inclined in relation to the first direction, on a warning vest, etc. Optionally or alternatively, multiple positions—for example, corner points or a contour—can also be ascertained for a coherent reflection, at which the intensity of the reflection exceeds a threshold value, wherein the threshold value can be fixed or dynamically tracked. In this case, the described analysis of the position(s) having a resolution between the pixels is especially also applied.

According to the invention, the analysis unit can be designed in such a way that the first position in the first direction, the second position in the second direction, the height in the first direction, the width in the second direction, the distance on the basis of an item of signal runtime information, and an intensity of the reflection are ascertained as a spatial intensity profile of the reflection, and/or are therefore accordingly provided and/or analyzed. The reflection can thus be characterized according to the invention, for example, in its spatial direction, distance, extension, and intensity, whereby a more detailed analysis and/or classification and/or identification of the reflection, and also possibly with respect to its source, i.e., the nature of the reflector, can also be ascertained and provided.

The analysis unit can determine, for example, a spatial 6D profile of the reflection having first position, second position, distance, height, width, and intensity of acquired reflections, and can ascertain an automatic target mark recognition and/or target mark identification by way of the correspondingly configured analysis unit on the basis of this profile for each received reflection. In one embodiment, the analysis unit can thus be formed, for example, in such a way that a uniqueness solution of retro targets such as prisms and reflector tapes, cat's eyes, . . . is ascertained using an analysis of the distance and intensity values, for example, on the basis of a comparison to known or stored data and characteristic values of reflection sources, on the basis of artificial intelligence systems or neuronal networks trained accordingly by machine learning, etc. During the analysis, a distance and/or depth staggering of reflections can also be taken into consideration in this case to differentiate reflection sources.

The first aspect of some aspects of the present invention also relate to a geodetic surveying device having a device for automatic target acquisition and/or target search such as the one described here, especially, for example, a geodetic surveying device in the form of a total station. However, a surveying device in the form of a theodolite, a tachymeter, a laser scanner, a rotation laser, or a laser tracker can also represent an embodiment of the invention. In this case, the device, in particular jointly with a telescope or a targeting device or also a base body of the surveying device, can be arranged to be rotatable, for example, around a—preferably at least essentially vertical—standing axis of the geodetic surveying device as the second direction. In particular, the target reflector search device can be housed, for example, in the support of the geodetic surveying device, thus especially rotatable around the standing axis but stationary in the tilt axis.

Some aspects of the invention also relate to a corresponding method for automatically locating a position of a reflective target mark, especially as described above and in particular using a device described here or a geodetic surveying device. In this case, at least emitting of optical radiation in the form of an emission fan, moving of the emission fan over a spatial region, and receiving of a reflection of a component of the optical radiation of the emission fan within a fan-shaped reception region take place. Using an analysis of a fan-shaped reception region using an optical detector, a determination of the position of the reflection on the basis of the analysis and an associated location of the movement then take place.

According to some aspects of the invention, in this case the optical detector is analyzed as a position-resolving optical detector having a linear arrangement of a plurality of pixels, which pixels are each formed as SPAD arrays, and the receiving is performed using an optical system having an imaging and direction-resolving optical unit. In this case, the optical system is formed and arranged in such a way that a blurry image or projection, which is expanded in relation to a focused image, of the reflection is performed on the acquisition region on the position-resolving optical detector. Using such an embodiment, on the basis of an analysis of a reception intensity over more than one pixel of the detector, a position resolution of the position of the reflection can be ascertained which is greater than the physical position resolution on the basis of the number of the pixels of the detector.

In this case, the determination of the position can especially be performed using an ascertainment of an intensity barycenter of the reflection on the position-resolving optical detector over a plurality of the pixels having a position resolution which is higher than the interval between two pixels. The determination of the position can additionally or alternatively also be performed using an ascertainment of an intensity barycenter of the reflection over multiple adjacent emission fans having a position resolution which is higher than the angle interval between two emission fans. In other words, a special aspect of many of the embodiments of the invention set forth here can also be considered that in one embodiment, the target search can be carried out faster in the spatial region in this case, in particular using a smaller number of emissions of emission fans and analyses of pixels. During the analysis, in this case, an ascertainment of a distance to a reflection can also be performed on the basis of a signal runtime of an optical pulse of the emission fan. An ascertainment of an extension of a reflection in the spatial region can also be ascertained during the analysis of the detector, in particular over multiple adjacent emission fans.

In this case, an analysis of a spatial intensity profile of reflections can also be performed, in particular in a position of an intensity barycenter of the reflection, in an extension of the reflection, and in a distance of the reflection. An automatic recognition and/or classification of the reflection can be performed in this case on the basis of the spatial intensity profile, especially a differentiation of spatial intensity profiles of a surveying reflector from spatial intensity profiles of possible interfering reflections.

The invention can be at least partially executed in this case by an electronic control unit which is at least partially programmable, for example, having a digital computer or comparable components. The first aspect of the present invention therefore also relates to an embodiment in the form of a computer program product having program code, which is stored on a physical data carrier or provided as an electromagnetic wave (for example, as a data signal transmitted by means of radio), and is designed for execution on a digital computer. According to the invention, such program code can especially comprise a sequence of instructions in this case, which are designed to carry out a parallel analysis of multiple pixels of a linear position-resolving detector, in particular with respect to a reception point in time and a reception intensity of at least one optical pulse, for multiple adjacent light fans covering a spatial region to be searched. In this case, the program code can analyze a spatial intensity profile for a reflection over a plurality of pixels and/or light fans, especially using a position of an intensity barycenter of the reflection in the spatial region, an extension of the reflection in the spatial region, a distance of the reflection in the spatial region, and/or an intensity of the reflection. In this case, the program code, in particular using a comparison of known reference profiles and/or a machine learning or artificial intelligence approach from a corresponding available software framework, can carry out a recognition and/or classification of the reflection, especially a recognition and differentiation of a reflection of a measurement reflector from a possible interfering reflection.

The second aspect of the invention relates to a method and a device for automatic image-based location of a target marker and is described below.

Methods for automatically locating or identifying target markers by means of an optoelectronic device or automatic target marker locator, e.g. in the context of a coordinative industrial or geodetic survey, are known in principle from the prior art, e.g. from WO 2011/098131 or EP 0815468. Examples of coordinative surveying devices are tachymeters or laser trackers, with which points in the space that are marked with the target marker, e.g. as part of a plumb rod, are measured with high accuracy. A target marker can have a retro-reflective unit (e.g. cubic prism), which is sighted with an optical measuring beam of the measuring device, in particular a laser beam. The laser beam is reflected back over a parallel path to the surveying device, by which the reflected beam is detected. In this case an emission or reception direction of the beam is determined, for example using sensors for angle measurement, which are assigned to a deflection mirror or a sighting unit of the system. In addition, with the detection of the beam a distance from the measuring device to the target point is determined, e.g. using time-of-flight or phase difference measurement, so that from the direction and distance the coordinates of the point are measured.

Surveying devices according to the prior art can be additionally implemented with an optical image acquisition unit in the form of an overview camera with a two-dimensional, light-sensitive array, such as a CCD or CID camera or a CMOS-array based camera, or a camera equipped with a pixel array sensor and an image processing unit, such as described in WO 2005/059473. The measuring device and the camera can be mounted one on the other, in particular, such that their positions relative to each other cannot be changed. For example, the camera is rotatable together with a laser tracker about its essentially vertical axis, but also pivotable up and down independently of the laser tracker, and therefore arranged, in particular, separately from the optics of the laser beam. Further, the camera—depending on the particular application, for example—can be designed to be pivotable about only one axis. In alternative designs the camera is installed in a common housing with the laser optics in an integrated design.

In addition, in modern surveying devices, on a spatially resolving sensor of a separate ATR camera, a deviation of the received measuring beam from a zero position is determined. The output signal of the sensor is generated by means of one or more photosensitive surfaces (PSD) and depends on the respective position of the light focus. By means of a downstream or integrated electronics, the output signal can be evaluated and the focal point can be determined. The process of determining the position of the focal point of the impinging light spot can be performed very rapidly and with a very high resolution. However, using the PSD only allows one focal point of the light distribution to be determined, rather than a distribution of multiple light spots. This measurable deviation allows a difference in position between the center of a retro-reflector and the point of incidence of the laser beam on the reflector to be determined, and the alignment of the laser beam to be corrected or tracked in accordance with this deviation, in such a way that the deviation on the sensor is reduced, in particular to "zero", and so that the beam is aligned in the direction of the reflector center and thus highly accurately onto the target marker. Tracking the laser beam alignment allows continuous target tracking of the target marker and continuous determination of the distance and position of the target point relative to the measuring device. The tracking can be implemented by changing the alignment of the motorized movable deflection mirror provided for deflecting the laser beam and/or by pivoting the targeting unit, which has the beam-guiding laser optics.

The target tracking described must be preceded by location of the target marker, so that the laser beam can be connected to the reflector. For this purpose, a detection unit with another position-sensitive sensor (PSD) with a relatively large field of view can be additionally arranged on the surveying device. In addition, additional lighting devices are integrated in generic coordinate measuring devices, with which the target or reflector is illuminated, in particular with a defined wavelength which differs from the wavelength of the distance measuring devices. The lighting devices can be used to illuminate the target and the detection unit can be used to capture an image of the target with an illuminated reflector. By imaging the specific (wavelength-specific) reflection on the sensor, the reflection position in the image can be resolved and thus an angle relative to the direction of acquisition of the camera and a direction to the target or reflector can be determined. A design of a laser tracker with such a target seeking unit is known from WO 2010/148525, for example.

A major disadvantage of conventional target location methods and target markers is, in particular, their insufficient robustness against incorrect identification of the target marker, for example in the case of multiple target markers located in the field of view, or of reflective or self-illuminating interfering objects which are incorrectly identified as target markers. In addition, in some known systems from the prior art, the complicated transmission of the target marker identities from the respective target marker to the surveying device has proved to be a disadvantage. In systems of the prior art which provide target location, therefore, there is a relatively high level of uncertainty as to the correct assignment of an object recognized as a target marker.

US 2017/0122734 discloses a method of locating or identifying target markers, in which a light pattern of optical radiation emitted by the target is detected in an image. To this end, disadvantageously the field of view of the light-sensing image sensor of the surveying device must be moved relative to the target marker (so that the image background is blurred and thus becomes distinguishable from the light pattern), and the exposure time of the one image must be matched to the light pattern. In addition, with the method presented there, locating a target which is moving relative to the surveying device, and thus the image sensor, is difficult if not impossible.

An object of some aspects of the second aspect of the present invention therefore is to provide an improved method for automatically locating target markers.

In particular, a more robust and/or faster detection of target markers, especially of a plurality of target markers in the measurement environment, can be sought.

This object is achieved by the implementation of the characterizing features of the independent claims. Features that extend the invention in alternative or advantageous ways are contained in the dependent claims and the description, including the description of the figures. All embodiments of the invention presented or otherwise disclosed in this document can be combined, unless expressly stated otherwise.

Some aspects of the invention relate to a method for automatically locating at least one target marker. In the context of the method, radiation is emitted from the target marker, wherein by means of modulation, in particular phase modulation, the radiation recurrently has a characteristic signature.

In addition, a first image sequence is recorded with a first frame rate in order to detect target marker radiation, e.g. by means of a target-finding camera of a surveying device, which forms a surveying system with the target marker.

Further steps involve carrying out a statistical evaluation of the first image sequence by reference to the signature and calculating a quality function, wherein the value of the quality function indicates a probability that target-marker radiation is detected in a given pixel, and identifying pixels with which target-marker radiation is likely detected, based on the value (associated with the pixel) of the quality function. A quality function related to the known signature is thus used to determine pixels in a first series of images, which have a specific probability of having registered target-marker radiation.

Furthermore, the method involves recording a second image sequence with a second frame rate which is different, and preferably (very much) higher, than the first frame rate, and evaluating intensity signals of the second image sequence for said identified pixels. These intensity signals are used to identify target marker radiation based on the signature. In other words, a further series of images is also recorded with a different frame rate and from this, a correspondence with the stored signature is tested for the pixels previously identified using the quality function, which are suitable for closer examination or further examination, based on the intensity.

This two-stage method allows, among other things, a comparatively low threshold to be set in the first test stage (i.e. based on the first image sequence), thus ensuring that in any event all target-marker radiation is classified positively and no target marker is "overlooked" or incorrectly "rejected". For example, pixels deemed to be identified are already those in which the value of the quality function (or a probability determined from it) indicates a minimum probability of only 50% for target-marker radiation detection (in other words, an uncertainty of 50% is accepted). Due to the second, more detailed test stage, it can be accepted that even non-target-marker radiation is (provisionally) classified as target-marker radiation, since this is then correctly rejected using the second image sequence and ultimately, only genuine target-marker radiation is identified as such.

The design of such a quality function, which allows signal changes caused by target-marker radiation to be distinguished from those from other light sources, depends in particular on the combination of image acquisition rate during this first image sequence and the modulation frequencies of the target-marker radiation. For example, the target-marker radiation can be selected such that a characteristic digital modulation pattern is repeated with the image acquisition rate during this first image sequence, but the pattern is alternately transmitted in inverted form. In the recorded image sequence, pixels that belong to target markers have alternately a high signal and a low signal in the following image. Pixels that do not belong to target markers have only a far lower probability of showing such a signature. In this case, the quality function can be a statistical function that compares the signal characteristic of a pixel within the acquired image sequence with the ideal theoretical signal characteristic, which corresponds to the acquisition of the characteristic target-marker radiation with the image acquisition rate used.

Optionally, the second image sequence is recorded with a second field of view, which is smaller than a first field of view of the recording of the first image sequence, wherein a position of the at least one second field of view corresponds to the respective said pixel, in particular wherein the at least one second field of view corresponds to a region of pixels, for example, of approximately 20×20 pixels, around a given identified pixel.

The two evaluation stages can thus firstly cover a large area of the environment for the target location with the first field of view, and secondly the use of the smaller second field of view (limitation of the number of active pixels of the image sensor) allows the second recording to be performed at a very high frame rate without the need to place particularly high demands on the image recording device (image processing capacities). For example, both image sequences can thus be recorded with a conventional digital camera, which can produce small image segments at rates in the kilohertz range, but can only record full images at a much lower rate.

The evaluation of the first and/or second image sequence is preferably carried out by means of difference images. This means that images from a particular image series are compared with each other and thereby, so to speak, the temporal profile of the values of a particular pixel is determined. By forming differences between the respective values of directly temporally adjacent images pixel-by-pixel, a value profile based on difference images is created for each pixel, which highlights pixels with values that vary during the image sequence duration more strongly than those which are temporally static. This evaluation with regard to the signature based on difference images is thus advantageous for the detection of modulated target-marker radiation.

Optionally, in the frequency domain the signature has a first spectral component adjusted to the first frame rate, and a second component adjusted to the second frame rate. Alternatively or additionally, in the time domain the signature has a start and/or end indicator (i.e. a signature component used for signaling the start and/or end of the signature).

Another option is to record the first and/or second image sequence over a period in which the emission of the signature is repeated multiple times. This means that images of a particular series of images are recorded over at least a period of time which corresponds to a multiple of the sequence of the signature (including any pauses set between two repetitions).

As a further option, the radiation has a wavelength in the near-infrared IR-A range, e.g. the radiation wavelength is 850 nm. As an alternative or in addition, the target-marker radiation is used for data transmission, so that a small number of user data items can be transmitted from the target marker to another device, for example.

Optionally, the second frame rate is at least ten times as high as the first frame rate, wherein the first frame rate, for example, is in the range between 45 Hz and 65 Hz and/or the second frame rate is at least 1 kHz, in particular at least 2 kHz.

Another preferred option is to record the first and second image sequences without synchronization to the emission of the target-marker radiation. The recording of a particular image sequence can thus optionally be started at any time, for example, without having to take into account the start of the emission of the target-marker radiation (and vice versa), wherein optionally the emission is started by an external communication signal, e.g. optically or via radio frequency. Alternatively, in addition to the modulated target-marker radiation, the target marker can also transmit synchronization signals on a further communication channel separate from or independent of the target-marker radiation, for example at a defined radio frequency. This allows the camera to acquire target-marker radiation synchronously by means of this additional signal transmission.

In a further extension of the method, a direction (e.g. in the form of polar and azimuth angles) to the target marker is determined by means of the first and/or second sequence of images based on respective identified pixels, wherein in addition a deviation of the direction from a nominal direction (e.g. zero or central direction) is optionally determined.

In a further extension of the method, as part of the method the identified pixels for which target-marker radiation is identified are used to automatically track the target marker based on the identified target marker radiation.

Some aspects of the invention also relate to a target marker locator, having an evaluation electronics and a spatially-resolving optoelectronic sensor, e.g. integrated in a digital camera, designed as a CCD or CMOS sensor, as a two-dimensional photodetector array or as a dynamic vision sensor, for example, for detecting target-marker radiation having a known characteristic signature.

The target marker locator is designed to use the sensor to record a first image sequence with a first frame rate and to statistically evaluate the first image sequence by means of the evaluation electronics. As part of the statistical evaluation, a quality function is determined, the value of which indicates a probability that target-marker radiation is detected in a given pixel, for which purpose the signature is stored in the evaluation electronics, and based on the quality function to identify pixels with which target-marker radiation is likely detected.

Furthermore, the target marker locator is designed to use the sensor to record a second image sequence with a second frame rate, which is different, in particular higher, than the first frame rate, and using the evaluation electronics to evaluate intensity signals from the second image sequence for said identified pixels and to identify target-marker radiation using the intensity signals and based on the stored signature.

The target locator, which can be designed as a separate unit or integrated into a surveying device, e.g. a tachymeter or a laser tracker, optionally has a long-pass filter that can be switched off and/or a near-infrared corrected lens. As an additional option, the sensor is part of an overview camera of such a surveying device.

Optionally, the evaluation electronics is designed to determine a direction to the target marker on the basis of a position of an identified pixel on the sensor. Preferably, the evaluation module is designed to control an alignment of the target marker locator, in particular continuously, based on a deviation from a pixel zero position, so that the deviation is reduced, in particular, to zero.

Some aspects of the invention further relate to a target marker having a modulatable, in particular near-infrared, beam source designed for emitting target marker radiation, wherein by means of modulation, in particular phase modulation, the target-marker radiation recurrently has a characteristic, in particular multi-level, signature.

In addition, some aspects of the invention relates to a surveying system with a target marker locator according to the invention and a target marker according to the invention.

The invention can be implemented at least in part by an electronic control and evaluation unit, which is at least partially programmable, for example with a digital computer or comparable components. Therefore, the second aspect of the second aspect of the present invention also relates to an embodiment in the form of a computer program product with program code, which is stored on a physical data medium or provided as an electromagnetic wave (e.g. as a data signal transmitted by radio) and is designed for execution on a digital computer.

Some aspects of the invention therefore offer the advantage of a robust, reliable automatic target marker location, wherein different target markers are uniquely identified. By means of the at least two different evaluation stages (i.e., for example, a first coarse selection step and a second fine selection step), on the one hand all target markers in the environment are reliably detected, and on the other hand, incorrect identifications are avoided. The use of different frame rates allows a quasi-synchronous sampling to be provided without having to perform true synchronization, in particular in embodiments with a multi-level signature, which therefore has a code component that is tailored to the first frame rate, and another code component that is tailored to the second frame rate. Alternatively, in the case of embodiments with an independent additional synchronization channel, as described above, by means of the same, images can also be acquired with true synchronization.

Another advantage of the robust camera-based detection of self-illuminating target markers by analysis of their transmitted signals at different camera frame rates is that a large field of view can be provided (e.g. with the first series of images), so that a large area of the environment is covered and a rapid identification of a target marker is also possible. For example, it can also be used to locate targets during continuous motion of the target locator. For example, the method can be implemented with a conventional overview camera, e.g. of a surveying device.

If the second field of view is selectively limited to pixels or regions of interest identified in the first method section, the image data volume and thus the processing effort are advantageously kept to a minimum. In addition, the use of difference images enables a further acceleration of the processing and a significant reduction of the memory requirements compared to the use of directly recorded images.

BRIEF SUMMARY OF THE DRAWINGS

The method according to the invention and the device according to some aspects of the invention are described solely by way of example in greater detail hereafter on the basis of specific exemplary embodiments schematically illustrated in the drawings, wherein further advantages of the invention are also discussed. In the specific figures:

FIG. 9 shows embodiments of a method according to the invention in the form of a block diagram;

FIG. 10 shows a schematic representation of an embodiment of the second aspect of the present invention with a geodetic surveying device with automatic target marker locator for identifying a target marker;

DETAILED DESCRIPTION

The illustrations in the figures are used solely for illustration and, if not explicitly indicated otherwise, are not to be considered to be exactly to scale. Identical or functionally similar features are provided, if practical, with the same reference signs throughout and are differentiated if necessary with a letter as an index. The illustrated schemes each show the basic technical structure, which can be supplemented or modified by a person skilled in the art in accordance with general principles. The terms essentially, substantially, or at least approximately express in this case that a feature is preferably formed, but does not necessarily have to be 100% exactly or exactly as literally described, but rather that minor deviations are also permissible—not only with respect to unavoidable practical inaccuracies and tolerances, but rather especially, for example, insofar as the technical effect essential for the invention is substantially maintained in this case.

Figure 1:
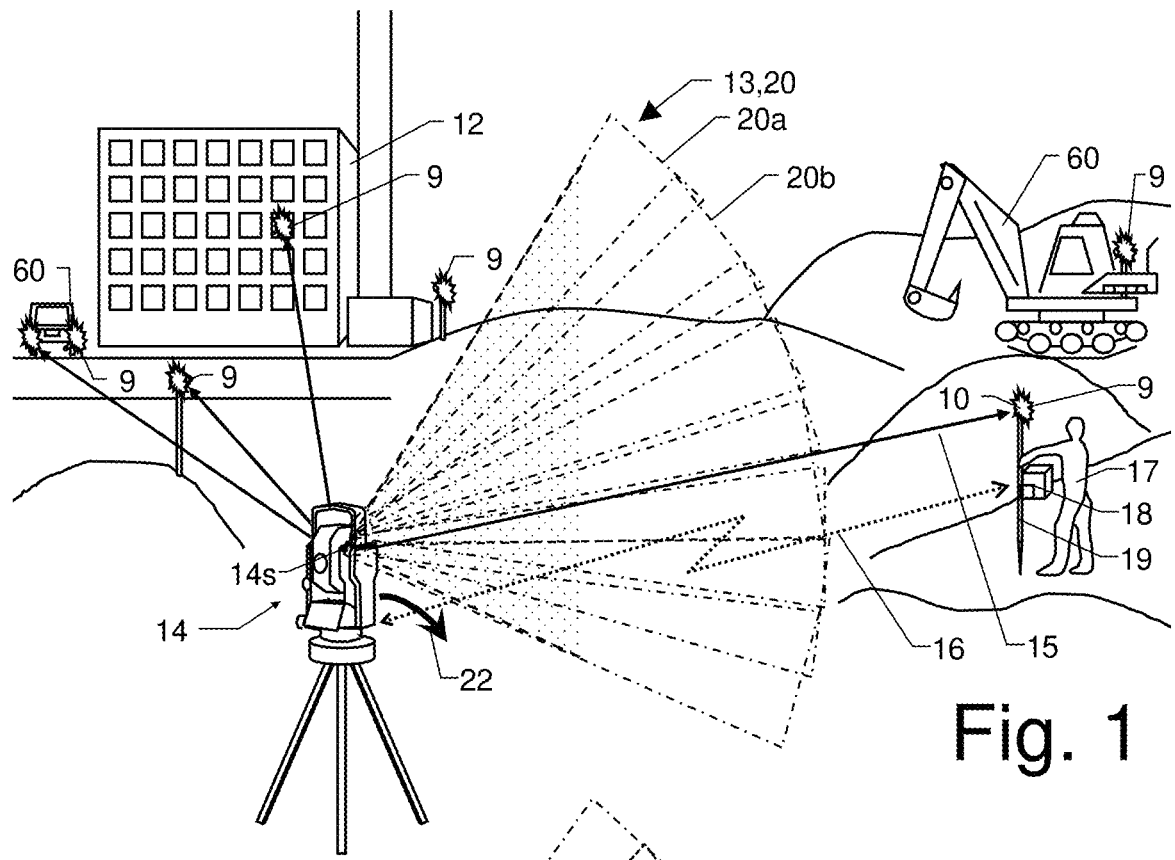
FIG. 1 shows a schematic illustration of a first exemplary embodiment of the first aspect of the first aspect of the present invention in a geodetic surveying device.

FIG. 1 schematically shows one possible example of an application using an embodiment of an automatic target search device 14s according to the invention in a geodetic surveying device 14. In this case, one or more surveying reflectors—in the example shown, for example, a reflector 10 as a measurement point in the surroundings of the device 14—are to be found and surveyed automatically using the positioned device 14. The reflector 10 can be formed as a surveying reflector—for example, as a triple prism on a surveyor's rod or pole (also having an operating unit 18 connected via a radio signal 16 here)—which is moved by a user 17 to different measuring positions. In this case, the device according to the invention in or on the surveying device 14 scans its surroundings for light reflections 9 to locate the reflector 10. The reflector 10 can therefore be targeted using the target axis 15 of the surveying device 14 to exactly survey the reflector 10 using a laser distance meter in the direction of the target axis 15. In this case, the locating of the reflector 10 to be surveyed is preferably to take place as rapidly and reliably as possible. During the searching (also referred to as scanning) of the surroundings, however, in general not only the reflection 9 from the desired surveyor's rod 19 is acquired, but rather also other reflections 9 from reflective objects possibly located in the surroundings, such as further reflectors in use, buildings 12, vehicles 60, headlights, cat's eyes, boundary posts, traffic signs, safety vests of workers, machines, etc.

The scanning or searching for reflections 9 is performed in this case using a modulated, preferably pulsed emission of a fan 13 of optical radiation in the visible or invisible spectral range and an acquisition and analysis of reflections 9 of a part of this optical radiation from the location of the reflector 9. For example, a light fan 13 in the form of a straight laser line having an aperture angle, for example, of approximately +/−20° is emitted by the surveying device 14, and this light fan 13 is rotated over the spatial region 22 to be searched. The emission fan 13 is in this case preferably an essentially continuous and essentially homogeneous light fan 13, for example, by a light beam being emitted as a fan preferably spanning a plane, which spans a straight line in the viewing direction on the object.

In one embodiment, the light fan 13 can be, for example, aligned essentially vertically and can be rotated or pivoted, preferably by up to 360°, for example, jointly with a targeting or telescope unit of the surveying device 14 essentially horizontally around the standing axis of the device 14 by a motorized drive unit over a spatial region 22 to be searched. The invention can, however, also be designed in other embodiments having other alignments of the light fan 13 and/or pivot planes of the movement of the light fan 13, also by less than 360°. Using a preferably pulsed emission of the light fan 13, higher optical peak powers can be emitted in this case while maintaining ocular safety, whereby stronger reflections 9 are also obtained and an improvement of the SNR is achievable. In this case, a bundle of multiple emission fans 13 or a family of fan bundles more or less results, which cover the spatial region 22 to be searched. In particular in consideration of an emission of the emission fan 13 in the form of chronological light pulses having pulse widths of a few nanoseconds, the spatial region 22 is thus scanned using a bundle of discrete fans. With correspondingly faster scanning and/or with a corresponding ratio of the scanning to the movement, however, in this case a quasi-continuous scanning of the spatial region 22 to be searched can also be performed. According to the invention, in the emission of the emission fan 13, not only simple single pulse sequences, but rather also more complex types of modulation, for example, coded pulse sequences, pulse amplitude modulation, phase modulation, etc. are applicable. As already mentioned above with respect to the coverage of the search space 22, in this case the rate of the distance measurements is preferably to be at least 50 kHz or more, for example, also 500 kHz or even more to achieve both an acceptable rotational velocity of the movement of the emission fan 13 and also a sufficient coverage of the search space 22.

Jointly with the emission fan 13, in this case a fan-shaped reception region 20 of the device according to the invention is also moved along, which preferably essentially corresponds in size and spatial location approximately to the emission fan 13 or comprises it. In one embodiment, reception region 20 of the reception fan can be formed approximately 3 to 10 times wider than the width of the emission fan 13 transversely to the fan direction, for example. In this case, according to the invention the reception region 20 is formed having a position-resolving optoelectronic sensor element or detector 11, so that a first location of the reflection 9 can be acquired or analyzed along the reception region fan 20—i.e., in the vertical direction in the above example.

The fan-shaped reception region or reception fan 20 is preferably designed in this case in such a way that it essentially covers the same angle range as the emission fan 13, in particular for greater distances of several meters, which are typical in matters of surveying, or several dozen or even hundreds of meters and more, in particular in road construction.

Using the position resolution according to the invention of the optical receiver or detector, in this case the reception fan 20 is divided during the analysis into multiple fan segments 20a, 20b, 20c etc. In other words, the position resolution is achieved using segmenting of the reception fan 20 along its alignment into multiple regions or segments 20a, 20b, 20c, ..., by a position-resolving electro-optical detector 11 being formed having a linear arrangement of a plurality of pixels 1, in particular more than two pixels. The number of the pixels 1 in the present invention in this case is also especially less than 100, in particular less than 64 or 32 pixels, however. For example, an embodiment of a detector 11 according to the invention can comprise, approximately, 5 to 16 pixels. These pixels are juxtaposed along a preferably straight line in the fan direction, wherein a distance between the sensitivity surfaces of the pixels should as much as possible be kept at zero or at least relatively small in relation to the size of the sensitivity surface of the pixel, preferably not greater than approximately 10%.

According to the invention, in this case the arrangement of an optical system of the receiving unit and the position-resolving electro-optical detector 11 is formed in such a way that the regions or fan segments 20a, 20b, ..., which are each acquired by one pixel, overlap. These segments 20a, 20b, ... are at least essentially equally large in this case. In other words—as also symbolically shown in the beam path—the projections of the sensitivity surfaces of the pixels overlap in the object plane in this case.

The pixels according to the invention are formed in this case in such a way that each of the pixels is formed as an SPAD array. Such an SPAD array comprises in this case a plurality of single photon avalanche photodiodes (SPADs) operated in the Geiger mode, which are interconnected to form a common output signal for the pixel, in particular using a parallel circuit of SPADs each provided with a series resistor—which form the SPAD array. In other words, the pixels according to the invention thus each only have a single output signal per pixel but are internally constructed having multiple photodiodes per pixel. Instead of a juxtaposition of multiple individual pixels, a single, specially designed producer-specific SPM diode pixel array can also be applied, for example, in the form of an Original Equipment Manufacturer (OEM) product.

According to the invention, in this case the electrical and digital signal analysis of the position resolution are performed not only solely using an analysis of a single pixel as such, i.e., using a simple association of a reflection 9 with a single one of the pixels, but rather the position resolution in the fan direction is greater according to the invention than the physical resolution of the detector 11 on the basis of the number of the existing pixels 1. Using the overlap according to the invention of the sectors or regions 20a, 20b, ..., a reflection 9 from a reflector 10 within the acquisition region is at least partially received by a plurality of pixels, wherein an intermediate position dependent on the reception intensity between the pixels is ascertained, especially by a relative ratio of the reception intensity from the pixels to an intermediate position being analyzed, or a location of a barycenter or a maximum value of the reflection 9 being physically formed and analyzed accordingly as an intermediate position.

In one embodiment according to the invention, in this case the analysis of the output signals of the pixels can take place in parallel, i.e., over multiple acquisition channels, especially each having one channel per pixel. In particular, in this case each of the pixels can be analyzed using a separate A/D converter channel, wherein the cycling of the A/D converter channels is preferably synchronized.

Figure 2:
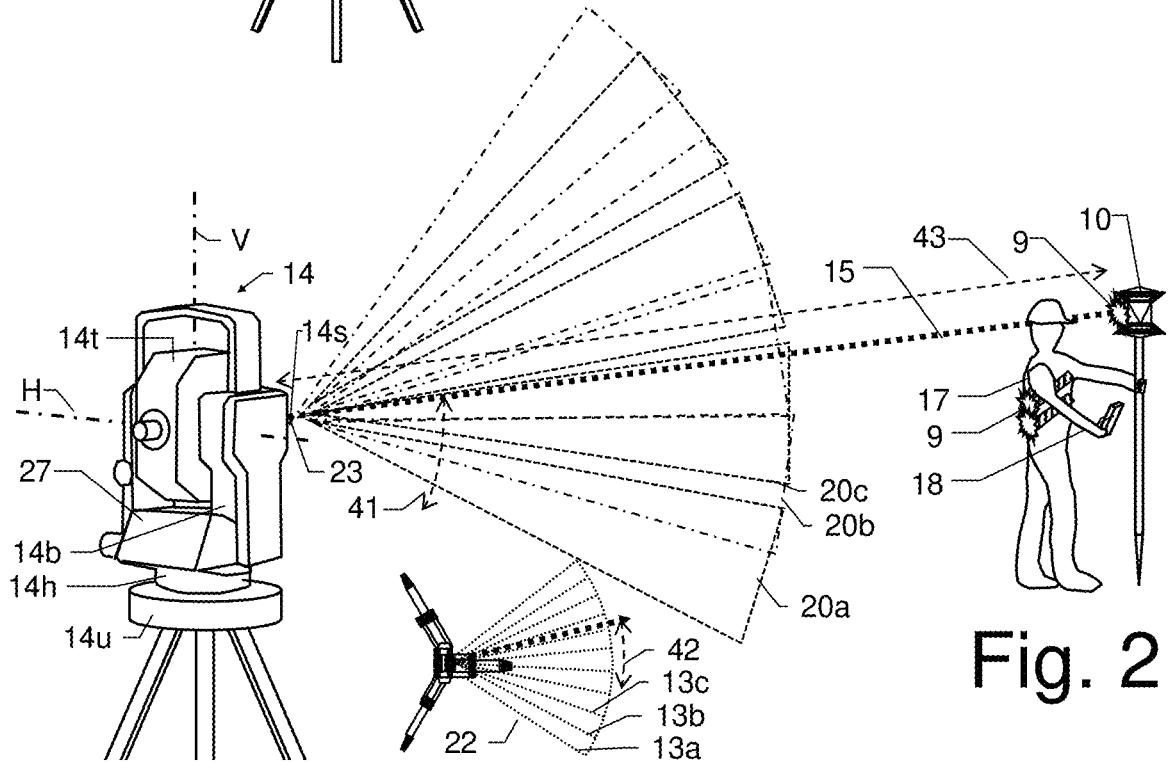
FIG. 2 shows a second exemplary embodiment of the first aspect of the present invention in a geodetic surveying device.

A first location 41, as a first coordinate of the first direction from which the reflection 9 was received, is determinable—at least roughly—as described above using the analysis of the position-resolving detector. A second location 42 of the object 10 causing or triggering the reflection 9 as a second coordinate in the direction from which the reflection was received results from the location of the movement of the emission fan 13 in the spatial region 22 at the appointed time of the respective light fan pulse 13a, 13b, 13c, ..., as illustrated by way of example in FIG. 2. In this case, for example, an angle encoder in the device 14 can acquire the alignment of the movement of the emission fan 13, especially at the point in time of the emission of the emission fan 13, at the point in time of the reception of the reflection 9, or at the point in time of the reflection (i.e., approximately half of the time between emission and reception). In the example shown, the drive and angle encoder 14h of the surveying device 14, which are formed to rotate the device 14 in relation to its deployment 14u around the standing axis H (or alternatively possibly also around the tilt axis V) can be used for the movement and determination of the second location. The target acquisition device 14s according to the invention can be formed in this case, for example, in the support 14b of the surveying device 14, which is only movable in a single axis, or also in the telescope body 14t, which is also movable in two axes with the target axis 15.

Using the detector according to the invention having SPAD array, in some embodiments it is also possible to dispense with varying the emission power of the pulses of the emission fan 13, as often has to be applied in the prior art, for example, in the form of an emission of a double pulse—for example, in the form of an emission of a weaker pulse directly followed by stronger pulse—to manage the restricted signal dynamic range of the prior art system.

Therefore, according to the invention, position coordinates of the object 10 causing or triggering the reflection 9 are ascertained in two dimensions, in the above example thus in a horizontal location (as a second location 42 of the present alignment of the emission/reception fan) and a vertical location (as a first location 41 in or between the sectors 20*a*, 20*b*, 20*c*, . . . of the reception fan) of the reflection 9 in the coordinate system of the device 14. In embodiments having non-vertical alignment of the target search fans and/or non-horizontal movement of the fans, the position coordinates can be converted accordingly on the basis of the geometrical relationships provided in this case.

Using the modulated pulse emission, not only can the above-mentioned higher peak power be achieved. A discrete point in time for the emission of the light fan 13 also results in this case, and therefore a discrete light fan in a discrete direction of the movement in the second direction. Moreover, a distance 43 between device 14 and reflection object 9 can be derived using a distance measuring unit on the basis of a runtime and/or phasing of the light fan light pulse 13*a*, 13*b*, . . . , from the emission at the device 14, to the reflection 9 at the object 10, and back to the device 14 on the basis of the propagation speed of the light—or multiple distances 43, if multiple reflections occur. The above-mentioned position coordinates of the reflection 9 can thus be supplemented by a third dimension in the form of a distance value 43. The distance measuring unit 23 can especially be formed in this case in such a way that it can also accordingly analyze multiple distances 43 in a multi-target case, in which for a single emission light pulse, multiple reflections staggered in the distance thereof are received from multiple targets. In one embodiment, in this case especially a parallel analysis can be formed using one respective dedicated distance measuring unit 23 per pixel.

A comparatively shorter pulse duration can often effectuate a comparatively more discrete or accurate determination of the position, in particular of the radial position in the distance direction, wherein a minimum required emitted pulse energy, peak power of the emitting element, etc., are often limiting here in a known manner. In practical embodiments, an engineering consideration of all parameters and effects on effectiveness, costs, utility, etc. has to be carried out here during the design.

In the case of an analog acquisition and/or acquisition digitized with sufficient resolution (of at least greater than two or more) of an intensity or amplitude of the reflection 9 on the optoelectronic detector, in addition to the three position coordinates, a fourth characteristic value can be associated with a respective reflection 9 and/or its source 10.

In one embodiment according to the invention, furthermore, in addition to the position, a spatial extension of a coherent reflection 9 can be ascertained, for example, approximately in the form of a height in the first direction and a width in the second direction, and/or in one or two extensions of a reflection 9 in another spatial direction. On the basis of such an extension, for example, essentially punctiform reflections 9 due to surveying prisms 10 can be differentiated from, for example, oblong-shaped reflections 9*b* of reflectors on warning vests of workers 17, from large-area reflections on windowpanes or the like, automatically on the basis of the extensions by a correspondingly formed analysis unit. In the ascertainment of the extension, the distance information of the distance measuring unit can preferably also be taken into consideration in this case, whereby a differentiation of reflections can also be performed on the basis of the depth staggering thereof. For example, in this case a triple prism 10 can also be automatically recognized by an analysis unit in front of a reflective glass pane in the background.

In one example of an embodiment of an analysis of the target finder according to the invention, for example, in a locating unit 27, an item of more than three-dimensional information can thus be acquired for an acquired reflection in this case. For example, an item of four-dimensional information having vertical position 41, horizontal position 42, distance 43, and intensity and, derivable therefrom, a reflectance of the target object 10. In this case, a reflection 9 acquired here in many cases is not only associated with one single discrete, two-dimensional or three-dimensional spatial coordinate, which may be determined, for example, in an intensity center or an intensity barycenter of the reflection 9. Rather, in one embodiment of the invention a positional or spatial reflection profile of the reflection 9 can be ascertained and analyzed. For example, to analyze, for example, in the first and second directions, a clustering of intensity values of reflections 9 can be performed, or also a clustering of the intensity or the reflectance in three dimensions—having first direction, second direction, and distance—wherein such an intensity cluster is ascertained with at least one (2D or 3D) position, preferably also with a (2D or 3D) extension by an analysis unit. Therefore, for example, a reflection profile in the positional neighborhood of a potential reflector 10 can be ascertained, especially, for example, in the case of a reflection source 10 of non-negligible extension, for example, a reflector strip on clothing, a window, etc. Such an analysis in a target search unit according to the invention also provides advantages in the case of non-negligible optical influences of the air such as flickers, mist, fog, etc.—or in the case of partially diffuse reflections, blooming, etc.—especially also with respect to a recognition and differentiation of discrete, specific surveying reflectors 10 in greatly varying surroundings and surrounding conditions.

A four-dimensional or higher-dimensional profile of the surroundings of the surveying device 14 can thus be derived, which can be produced by corresponding algorithms—which can be produced in a classic manner and/or with incorporation of machine learning and artificial intelligence according to the rules of the art—and provide an analysis of the profile, which is formed in such a way that it recognizes potential target reflectors 10, differentiates them from potential interference signals and spurious signals, and locates them in a known coordinate system. For example, with such a profile or cluster, an interpolation of a reflection center as the location of the reflection can also be performed, for example, in the form of a computed center point, barycenter, centroid, expected value, etc. During the analysis, a spatial extension of the profile or cluster of a reflection 9 can in this case also be taken into consideration to differentiate external targets (such as security vests, traffic signs, glass or painted surfaces, headlights, cat's eyes, etc.) to exclude spurious targets, wherein preferably a possible depth staggering of reflections 9 can also be taken into consideration to suppress spurious reflections.

A user 17 having the reflector 10 can in this case also operate the surveying device 14 remotely using an operating unit 18 via a radio connection 16. In an optional embodiment, in this case the device 14 can carry out a rough determination of a rough direction to the reflector 10 by means of the radio connection, for example, to restrict the search region 22 of the automatic target finder according to the invention to defined surroundings with respect to this rough direction and/or to identify the reflector 10 and/or to differentiate it from other reflections 9, which could potentially be confused with the reflector 10 of the user 17. To determine this rough direction, for example, rough radio locating of the mobile operating unit 18 can be performed, for example, using diversity receiving using multiple antennas from which a probable direction to the received radio emitter may be derived. Such approaches are also known, inter alia, in the (planned) specifications of radio connections such as Bluetooth (for example, >5.0), WLAN, mobile radio, etc. A consideration of a directional characteristic of a radio antenna moved along during the movement of the device 14, for example, also during the movement of the light fan 13 (for example, in the second direction) can also be used to derive a rough direction to the operating unit, for example, on the basis of a directional dependence of the reception signal strength and/or phasing. This rough direction can then be refined by means of the target finder according to the invention, and/or a reflection 9 from the reflector 10 can thus be differentiated from other reflections 9. The operating unit 18 can also determine its rough position itself by means of a GPS receiver or locating in a mobile radio network, and can provide this via the radio connection as the starting point for the target search according to the invention, from the exact or at least roughly known deployment of the device 14.

Figure 3:
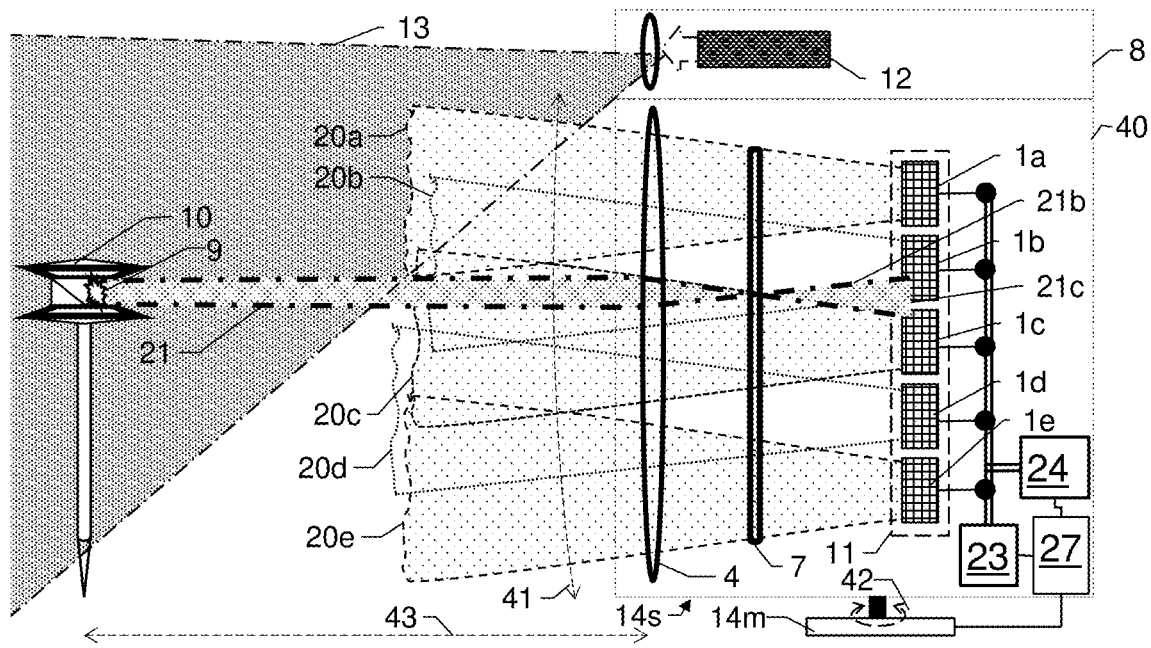
FIG. 3 shows a first schematic illustration of an exemplary structure of an embodiment of the invention.

FIG. 3 shows an example of a schematic sectional illustration of an embodiment of a target reflector search device 14s according to the invention, in which a position of the object 10 triggering a reflection 9 is determinable in a locating unit 27 using an analysis of the receiving unit 40 and the second direction 42 and preferably a distance 43. In this case, the emitting unit 8 emits an emission fan 13 (located in the plane of the sheet). This light fan 13 is projected by means of a light source 12 and an emission optical unit into the surroundings to be searched, and can be moved between or during the emission of the light fan 13, preferably motorized and equipped with an encoder 14m. Light-reflecting targets 10 encountered in the surroundings in this case, for example, the surveying reflector 10 shown, reflect a component 21 of the light of the emission fan 13 in this case back to the target reflector search device 14s according to the invention. A receiving unit 40 is formed there in such a way that this light 21 reflected from the targets 10 is acquired by the photosensitive detector 11, which provides corresponding electrical signals for further analysis. In this case, the receiving unit 40 is formed in such a way that it also covers a fan-shaped reception region 20, which preferably essentially overlaps with the emission fan 13. According to the invention, the receiving unit 40 comprises an imaging optical unit 4 in this case, which is preferably designed as a fixed-focus optical unit. A correspondingly formed and arranged aperture 7, for example, formed as a slit aperture, restricts a field of view of the receiving unit 40 in this case to the reception fan 20, for example, wherein the aperture 7 can be arranged in the focal plane of the fixed-focus optical unit 4.

The photosensitive detector 11 is formed and arranged in this case in such a way that it is designed to be position-resolving along the reception fan 20. In this case, multiple discrete pixels 1a, 1b, 1c, 1d, 1e are arranged along an image of the reception fan 20 in the object space toward the image space—i.e., behind the optical unit 4 viewed from the outside—so that the reception fan 20 is resolved along the fan into multiple reception segments 20a, 20b, 20c, 20d, 20e. According to the invention, an imaging optical unit 4 is applied in this case, but the photosensitive detector 11 is intentionally arranged outside the optimum imaging depth of field of the optical unit 4, as it is with the blurry image 21b of the reflected light component 21. According to the invention, for example, this is precisely not as would be the case, for example, in the case of an image sensor of an imaging camera or in classic applications of an imaging optical unit 4.

In one embodiment according to the invention, in this case the number of the pixels 1, i.e., the number of the individually readable photosensitive sensors for the position resolution along the fan 20 can be kept small. According to the invention, hundreds of pixels 1 are thus not necessarily provided for the position resolution, but rather only a few pixels 1—for example, approximately 5 to 25 pixels, especially approximately 5 to 15, or, for example, approximately 10 pixels are sufficient—wherein each of these pixels 1 is formed in this case as an SPAD array, however. Such a pixel 1 in the form of a single SPAD array comprises in this case a plurality (for example, approximately 100 to 10,000 units) of photosensitive cells operated in the Geiger mode, which are interconnected to form a single, common output of the pixel 1. According to the invention, an analog analysis of the respective outputs of the pixels 1 is performed in this case, preferably a parallel analysis of all pixels 1, which can be executed in one embodiment as a simultaneous or at least essentially simultaneous or quasi-simultaneous analysis. The analog analysis can also be performed with application of an analog-to-digital converter in this case, which provides a value-discrete analog representation, in particular having a resolution of more than two, especially at least 16, at least 128, or preferably even more value quantification steps.

The individual pixels 1 also each comprise in this case, as SPAD arrays 1a, 1b, 1c, 1d, 1e, a correspondingly larger sensitivity surface than a single semiconductor photodiode of comparably high electronic signal bandwidth. For example, an SPAD array having a sensitivity surface of approximately 1×1 mm can have a signal bandwidth in the gigahertz range (GHz), which is not achieved in classic photodiodes at comparable size.

In one embodiment according to the invention, the analysis of the outputs of the pixels is performed in this case using a distance measuring unit 23 having sampling frequency which is sufficiently high to carry out a runtime measurement of emitted light pulses of the emission fan 13. This distance measuring unit 23 has in this case a distance resolution at least in the decimeter range, preferably in the centimeter range, for example, at least having a sampling rate or sampling frequency of greater than 1 MHz, for example, in the range of approximately 80 MHz or more.

The position resolution and/or angle resolution of the reception fan in the first direction 41 achieved according to the invention using the reception fan longitudinal direction position determination unit 24 on the basis of the signals of the few pixels 1a, 1b, 1c, 1d, 1e exceeds in this case the fundamental resolution provided by the number of the pixels 1, which results as the total acquisition fan angle by number of pixels 1. Using the defocusing, beamforming or beam expansion, and parallel analog analysis according to the invention, a position resolution along the reception fan 20 can be achieved in this case which exceeds that of the number of the provided pixels 1. In this case, the analog signals, which correspond to the reception intensity per pixel 1, are analyzed as weightings over multiple juxtaposed pixels, wherein it is concluded, on the basis of the ratios of the intensities at intermediate positions of the point of incidence of the reflected light between the pixels 1, which intermediate positions improve the position resolution. Such an intermediate position can be ascertained in this case, for example, by interpolation, barycenter formation, expected value computation, trained artificial intelligence systems, model formations, in any case also specifically for different types or classes of measurement targets or interfering reflections, etc. In addition to the intermediate position, a possible extension of the received reflection over multiple pixels can also be acquired in this case.

During the signal analysis of the pixels 1, not only the value of the analog outputs of the pixels 1, but rather, using the distance measuring unit 23, additionally also the incidence time, or in other words the runtime or the distance 43 dependent on this runtime to the reflection target 10, can be taken into consideration, whereby a distance staggering of reflections 9 is ascertainable, and it is thus possible to prevent, for example, a measurement reflector 10 in front of a mirrored glass pane from being acquired as a single reflection 9, but rather the reflections 9 and the background reflection can be differentiated by the analysis unit as separate reflections 9 using the system according to the invention on the basis of this depth staggering. Multiple reflections 9 can thus not only be differentiated on the basis of the depth staggering thereof and optimally also assisted by intensity profiles of the reflections 9 (for example, a bar graph of a frequency density of the analog values over direction and/or time) and/or on the basis of a reflectance of the source of the reflection 9 derived therefrom, but rather optionally also identified and/or classified, for example, as a measurement reflector 10.

The intensity profiles can in this case not only be analyzed along the first direction 41 of the reception fan 20, but rather also additionally or alternatively in the second direction 42 of the movement of the reception fan 20 over a spatial region 22, for example, on the basis of a position measurement of a movement of the target search device 14s according to the invention. The locating unit 27 is preferably formed in this case in such a way that it ascertains an intensity profile of the reflections 9 in two dimensions, i.e., for example—in the first direction 41 and second direction 42—in the first direction 41 and distance 43—and/or in the second direction 42 and distance 43—or also in three dimensions, thus—in the first direction 41, second direction 42, and distance 42—and is analyzed by the locating unit 27. The analysis can in particular be performed in this case in such a way that the analog values obtained from the pixels 1a, 1b, 1c, 1d, 1e more or less as a fourth dimension, are analyzed as a spatial profile—for example, via first direction 41, second direction 42, and/or distance 43 (or runtime). In this case, spatially coherent intensity clusters can especially be identified and delimited from one another. In this case, these intensity clusters can be formed in particular in such a way that these clusters represent reflectances, especially in that a distance influence is subtracted from the intensity values, or the reception signals are scaled over the respective associated distance values thereof. Such a reflectance usually represents a characteristic target object value in this case, on the basis of which a target object 10 can be identified and/or classified. For these intensity and/or reflectivity clusters, a location (for example, in the form of a position of a barycenter or an expected value of the cluster) and/or a spatial extension (for example, in the form of an extension, dimension, or standard deviation of the cluster), and/or a geometric shape of the cluster (for example, a point, a line, a surface, and the position thereof and possibly a location of the shape in space) can be ascertained by the analysis unit 23, on the basis of which the reflections 9 associated with the clusters can be recognized and possibly also identified and/or classified. In addition to analytical and modeling analyses, in this case approaches from the field of machine learning and/or artificial intelligence can also be implemented. In this case, training data from typically occurring reflectors such as measurement reflectors 10, but also spurious reflections, for example, from safety vests, headlights, glass panes, mirrors, cat's eyes, etc. can also be recorded and/or virtually simulated, in particular under variable surrounding conditions, etc.

Figure 4:
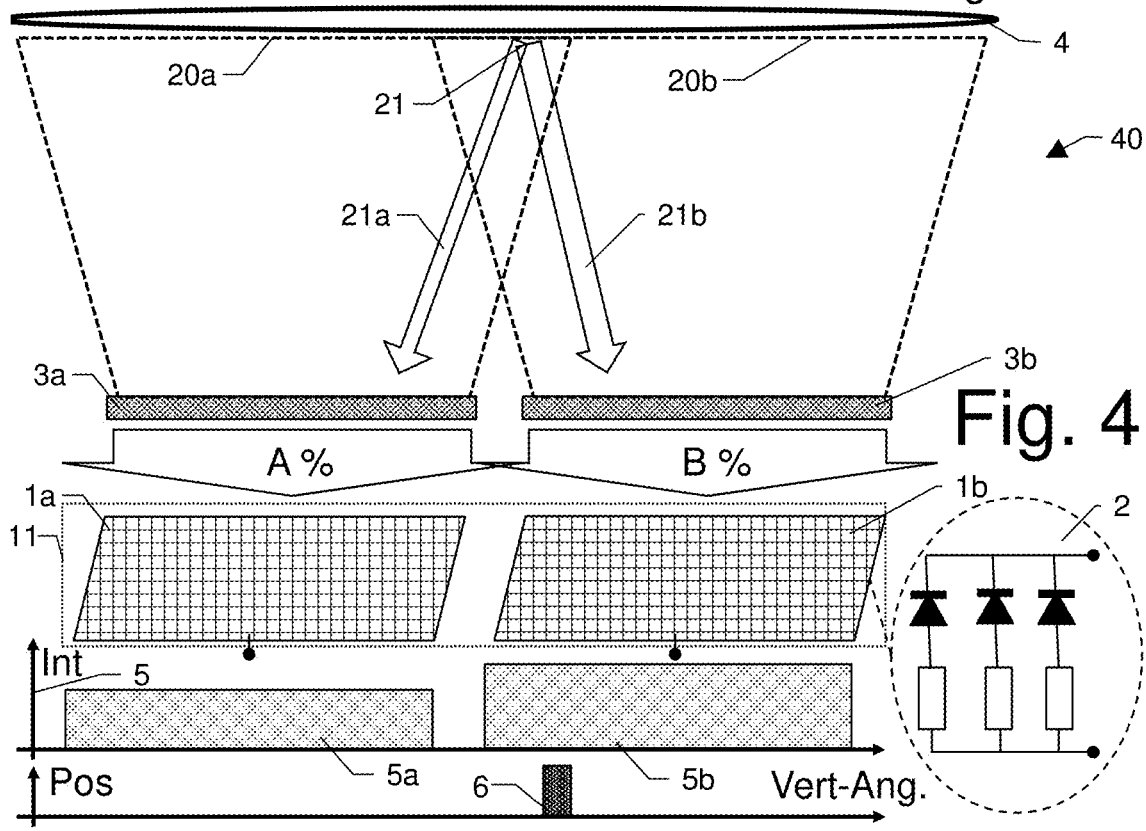
FIG. 4 shows a second schematic illustration of an exemplary structure of an embodiment of the invention.

A detail of a further embodiment according to the invention is shown in a simplified manner in FIG. 4, which uses, for example, an optical diffuser or a microlens array 3a, 3b in the beam path of the reception fan 20. The exemplary illustration of only two pixels 1 is not to be understood as restrictive here, but rather is to be viewed as a detail, since a device according to the invention preferably comprises more than two pixels 1 (but also not hundreds of pixels 1). In this case, the pixels 1a and 1b are again formed in the form of SPAD arrays 2 which are symbolized by way of example in the form of the schematic illustration 2 and the surface pattern of the SPAD array as an array grid and also one common electrical output per pixel. Of the light 21 of the reflection incident on the reception unit within the reception fan 20 of a fan-shaped light pulse emitted by the emitting unit, a first component 21a of A % is received by the first pixel 1a in this case, which results at the pixel output in the analog intensity value 5a, at a point in time which corresponds to the distance-dependent runtime of the light pulse. A second component 21b of B % received by the first pixel 1b, which results in the analog intensity value 5b at the pixel output, also at the same point in time, which corresponds to the distance-dependent runtime of the light pulse 21. In this case, the optical unit 4 of the receiving unit is formed and arranged according to the invention in such a way that a point within the reception fan 20 in the object space is imaged on a non-negligibly small surface on the arrangement of the photosensitive pixels 1a, 1b. This can be performed as explained above using an intentionally defocused arrangement of the pixels 1a, 1b, alternatively or additionally, however, in this case a diffuser or microlens array 3a, 3b shown here can also be arranged behind the imaging optical unit 4, in particular in front of the pixels 1a, 1b. In addition to a single continuous microlens array or diffuser 3a, 3b for all pixels 1a, 1b, a separate diffuser 3a or 3b can also be applied in this case for each of the pixels 1a or 1b, respectively, which distributes incident light 21a, 21b essentially uniformly—in particular more uniformly than without this diffuser—over the sensitivity surface of the respective pixel 1a, 1b. Light 21a or 21b, which is incident on a portion of the pixel 1a or 1b, is preferably distributed in this case by the diffuser 3a or 3b over a larger region of the pixel 1a or 1b, in particular over the entire SPAD array of the pixel 1a or 1b, respectively.

The respective segments 20a and 20b of the reception fan 20 associated with the pixels 1a and 1b partially overlap in this case. In this case, an analysis of the location of the incident reflection 21 between the two pixels 1a and 1b can be ascertained on the basis of the intensity percentages A % and B %. In the example shown, for example, the spatial position 6 of the incidence of imaged reflection 21 along the juxtaposition of the pixels (of which 1a and 1b are partially shown here) can be ascertained, for example, by an interpolation being performed on the basis of intensity distribution 5a and 5b. In addition to a solely computational interpolation, a lookup table, machine learning, etc. can also be applied in this case. A location of the reflection 21 within the reception fan 20 is thus ascertained with a positional resolution which is greater than that which would result solely from the number of the pixels 1 for this acquisition region 20.

In this case, a chronological separation of positionally overlapping reception signals 5a, 5b can particularly advantageously be applied during the analysis. During this, only signals over adjoining pixels 1a, 1b are interpolated in the case of which the signals 5a, 5b were received practically simultaneously on the time axis (for example, with a time delay of <10 ns)—and thus (at least highly probably) originate from the same reflective object 10. In this manner, different reflective objects 10—even if they are closely staggered in the direction of viewing—may be automatically differentiated in the scope of the analysis in a comparably simple manner by the locating unit 27 described elsewhere.

In other words, in a receiving unit 40 according to the invention, the fan-shaped reception region 20 is divided using a position-resolving detector 11 having a row of pixels 1 into a plurality of segments 20, 20b, . . . . In this case, each of the pixels 1a, 1b, . . . is associated with one of the segments 20a, 20b, . . . . An acquisition region 20a, 20b of one of the pixels 1a, 1b thus forms one of the segments 20a, 20b in each case. According to the invention, the receiving unit 40 is formed in this case in such a way that these acquisition regions 20a, 20b of adjacent pixels 1a, 1b partially overlap in the object space in front of the imaging optical unit 4. A reflection 9 in the overlapping region of these acquisition regions 20a, 20b of two pixels 1a, 1b results in this case in an output signal at both participating pixels 1a, 1b. In this case, the light 21 is divided differently between the two pixels 1a, 1b in accordance with the position of the light reflection 21 in the overlap region, in particular the received intensity 21a, 21b of the light at the pixel 1a, 1b is dependent on the surface component of the reflection 21 which is acquired by the respective pixel 1a, 1b. Using an analog output signal of the pixel 1a, 1b, which is dependent on the received intensity 5, in this case a position 6 of the reflection 21 from the target object 10 between the two adjacent pixels 1a, 1b is ascertainable according to the invention. Moreover, an item of information about the reflectance and/or extension of the object 10, from which the light 21 reflected by its reflection 9 originates, can be derived in an overall view of the intensity over both pixels 1a, 1b. This item of information can then be used to derive whether and/or with which probability the reflection originates from a surveying target mark 10 having specific and/or known reflectance or whether it is another type of undesired interfering reflection.

In this case, optionally not only a runtime of the light signals from the target finder 14s to the reflection 9 and back can be ascertained using the specific pulsed emission of the emission fan 13. This also enables an evaluation—and therefore also an electrical and/or numeric suppression or subtraction—of possible bias or interference signals, for example, due to ambient light, possible active light sources in the acquisition region, base emissions of the surroundings, etc., which are received outside the time of the pulse reception and/or are received essentially constantly. A differential image analysis of the acquired spatial region 20 can thus also be performed, for example. Thus, for example, a chronological derivative of the reception signals can be analyzed, for example, by corresponding numeric filtering or analysis of the analog, preferably digitized signals and/or using an electrical high-pass filtering of the analog output signals of the pixels, a dynamic bias control, etc.

Figure 5:
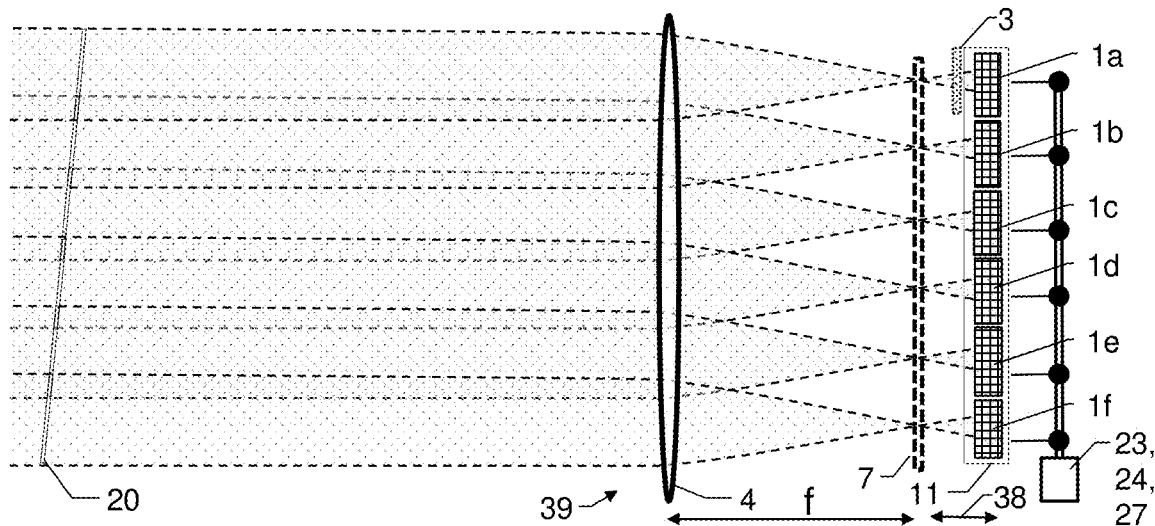
FIG. 5 shows a third schematic illustration of an exemplary structure of an embodiment of the invention.

An example of an acquisition device according to the invention is shown once again in FIG. 5. The optoelectronic detector 11 is formed as a position-resolving optoelectronic detector 11 having a line of SPAD array pixels 1a, 1b, 1c, 1d, 1e, 1f, if and is arranged and formed jointly with an imaging optical unit 4 in this case in such a way that a point from the fan-shaped reception region 20 (which is also indicated here in its cross section) is imaged blurred on the pixels 1a, 1b, 1c, 1d, 1e, 1f. The detector 11 (or the output signals of its pixels 1) are analyzed by a position determination unit 24 for the position resolution in the fan longitudinal direction, a distance measuring unit 23, and a locating unit 27 as described.

Reflective targets 10, thus in particular a retroreflective target mark to be located, are located in this case especially within the hyperfocal distance, i.e., in a range of the finite object distance at which—in accordance with typically fixed-focus design of the optical system—objects 10 located in infinity can also still just be imaged with acceptable blurriness. The so-called depth of field then extends from half the hyperfocal distance up to infinity. According to the invention, however, sharp imaging of reflections 9 from the objects 10 which are located in the range of the depth of field is intentionally omitted. Instead, for example, using a defined axial displacement 38 of the detector 11, a blurry image of a reflection from the target object is generated from the actually sharply imaged focal plane.

The above-mentioned lower limit of the object distance often does not represent a significant obstacle in the scope of the first aspect of the present invention, since it is per se designed for an analysis of a blurry image and therefore an even greater level of blurriness only displays minor negative effects with respect to reception signal strength and directional resolution. Moreover, at close range a greater part of the divergent, fan-shaped acquisition region is typically used than at long range, whereby the relative resolution can be at least partially compensated for again. Such a close range (for example, of a few meters) is also not used or is only used rarely in many surveying devices.

In one example of an embodiment, for example, as shown for imaging from the infinite (or imaging equivalent thereto within the depth of field range of a fixed-focus optical unit), the image distance can be set approximately identically to the focal length f of the optical unit. According to the invention, in this example an imaging optical unit 4 can thus be used, in relation to which the optoelectronic detector 11 is intentionally arranged by a defined distance 38 in relation to the focal length f, i.e., in a defined manner in the back focus (or alternatively also in the front focus).

In an example shown hereafter, an intentionally dimensioned blurriness, which is preferably different in the first and second directions, is explicitly introduced in a comparable manner by means of an optical diffuser 3 in the beam path—which can be arranged in front of, in, or behind the image plane—which exceeds the minimal blurriness which would actually be achievable using the imaging optical unit 4, especially by a multiple of the technically achievable minimal blurriness. In the design of the imaging optical unit 4, the requirement for the imaging optical unit 4 can thus also be shifted away from the sharpest possible imaging and more toward a correct position imaging. In another embodiment, the accurate position imaging can also be performed using a corresponding position calibration of the receiving unit, in particular an arithmetic calibration of the analysis of the detector 11.

Additionally or alternatively, in this case an optical beam expander or diffuser 3—indicated in this figure by way of example in front of one of the pixels—can be attached in front of the detector 11 or in front of its pixels 1a, 1b, 1c, 1d, 1e, 1f, which causes a blurry distribution of the light incident from the imaging optical unit 4 on a larger surface than its point of incidence. In one embodiment, in this case the optical system 39 can preferably be designed in such a way that this surface of the light bundle has a greater extension in the first direction (in the fan direction) than transversely thereto. The detector and the optical system 39 associated with it are thus designed and arranged in such a way that according to the invention a bundle cross section at the point of incidence in the detector plane is used which is larger than a minimal circle of confusion, as would classically be used in imaging or photographic systems. In one embodiment, for example, in this case a circle of confusion or more generally a beam bundle cross section can be formed, which is in particular larger in the first direction than one of the pixels 1a, 1b, 1c, 1d, 1e, 1f.

In one embodiment, the optical beam expander 3 can be formed having a microlens array. This microlens array can be formed, for example, using many cylindrical lens rods, typically approximately 100 μm wide, and can be arranged in such a way that it asymmetrically expands the light bundle incident from the reflector target 10 and shaped by the receiving objective 4 directly before the array made of pixels 1. For example, the light spot in the detector plane can thus be expanded to a size of, for example, approximately 2.2 mm×0.9 mm on the sensitivity surface of the detector 11, wherein the SPAD pixels 1 of the detector 11, having a size of approximately 1 mm×1 mm, are arranged without spacing in a line. Using the blurry, expanded imaging according to the invention, not only can a subpixel interpolation be carried out to increase the resolution during the analysis of the detector 11, (using which the technology-related larger pixels 1 and the resolution thus limited of a detector 11 of reasonable structural size may be at least partially compensated for). Using the blurry, expanded imaging, according to the invention it is also possible that all microcells of an SPAD pixel 1 are illuminated at least essentially homogeneously—whereby, for example, a collapse of the effective usable dynamics of the SPAD pixel 1 due to illumination of only a part of the available microcells can also be prevented or at least reduced. Especially in this case, using an embodiment according to the invention having an optical system having asymmetrical beam expansion, both a loss of received light can be avoided and also a pixel interpolation over more than one single pixel 1 can advantageously be enabled.

In this case, the field-of-view of the detector 11 can be limited further to the desired reception fan 20 using a slit aperture 7. For example, in an embodiment having back focus, in this case a slit aperture 7 restricting the field-of-view of the detector 11 can be arranged in the beam path between imaging optical unit 4 and detector 11, especially, for example, approximately in the range of the focal length f.

Figure 6:
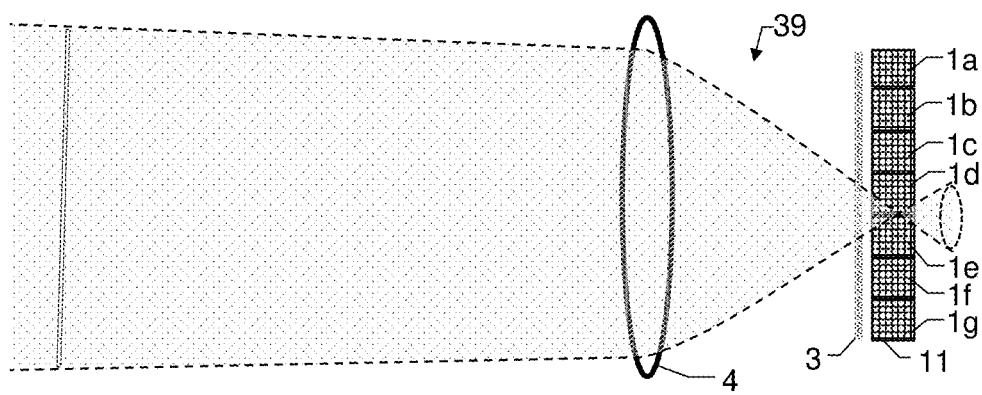
FIG. 6 shows a fourth schematic illustration of an exemplary structure of an embodiment of the invention.

FIG. 6 shows an example of an embodiment according to the invention having an optical beam expander 3 having diffuser plate, hologram, or micro-optical lens array, etc., which causes blurry imaging of the object space in spite of the imaging optical unit 4, so that light reflected from an object 10 from the object space is expanded in such a way that it is acquired by more than one single pixel 1. In this case, as shown here, a continuous diffuser 3 can be applied for multiple pixels 1a, 1b, 1c, 1d, 1e, 1f, 1g of the detector 11, or alternatively an individual diffuser can be applied for each of the pixels 1a, 1b, 1c, 1d, 1e, 1f, 1g. Especially in the case of a solely randomly scattering diffuser 3 for multiple pixels 1, this diffuser 3 can also be arranged in the sharply imaged focal plane of the optical unit 4, in that the optical properties of the diffuser 3 effectuate the blurry imaging toward the detector 11. A front focus or back focus arrangement is thus not absolutely required, but it is optionally also additionally possible—especially if the diffuser 3 is used to distribute the received light more homogeneously over the sensitivity surface of a pixel 1. An advantageous expansion or forming of the light bundle reflected from the object space and imaged can also be achieved by means of specially adapted holograms or astigmatic microlens arrays, for example, using a corresponding light forming plate introduced into the beam path. To keep the structural length of the receiving unit small, in this case the optical light forming plate can be arranged in front focus arrangement.

The light forming of an optical system according to the invention can especially be formed in such a way that the light bundles assume an oblong elliptical (as indicated in this figure) or rectangular extension on the pixel plane. By means of such micro-optical components, with corresponding design, the radiation reflected from the target object can be used optimally, i.e., essentially without loss.

Figure 7:
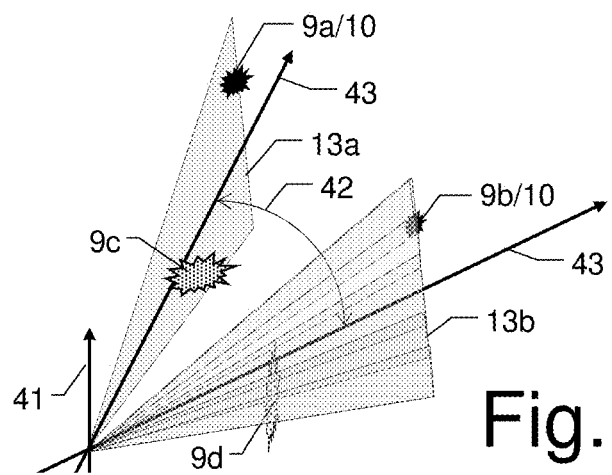
FIG. 7 shows an illustration of an example of an acquisition of a target mark search in one embodiment of the invention.

FIG. 7 shows a sketch of two adjacent emission fans 13a and 13b (or the respective associated reception fans, respectively), wherein the angle distance thereof in the second direction 42 is shown disproportionately wide for the sake of clarity (see, for example, values typical in practice mentioned elsewhere).

The light fans 13a and 13b shown comprise in this case reflections 9a, 9b, 9c, 9d, which are acquired by the position-resolving detector of the target search device according to the invention in a blurry image, and of which in each case a first location is ascertained in the first direction 41 as described, for example, as an angular position within the fan 13 in relation to its optical axis 43—as also indicated, for example, with the segmenting of the fan 13b. Furthermore, a distance measuring device is connected to the detector, which determines a distance 43 for each of the reflections 9a, 9b, 9c, 9d on the basis of a run-time measurement between emission and reception of the light of the emission fan 13. The second location in the direction 42 of a reflection 9 results with the association of a reflection 9 with one of the emission fans 13a, 13b during the movement of the emission direction of the emission fans 13. For example, in this case spherical coordinates of the position or object result, at which the reflection 9 occurs, for example, having polar angle (=first location in 41), azimuth angle (=second location in 42), and radius (=distance in 43), which can also be converted in a known manner to other coordinate systems, however, in particular to a coordinate system of the surveying device. On the basis of these three coordinates, the reflections 9 may generally be differentiated well, so that a differentiation of different reflection objects (also referred to here as clusters) may be carried out automatically by a locating unit on the basis of these locations, in particular on the basis of the distance information (or in other words the point in time of the incidence of the reflection 9).

In addition to this position, a geometrical extension or size of the reflection 9 can optionally also be determined, for example, if the reflection 9 occurs in the three dimensions in a geometrically coherent manner (as a cluster) over a plurality of emission fans 13 or over multiple pixels of the detector, a size and/or shape of the reflecting object can be determined therefrom. An actual extension of the reflective object can be determined from a measured apparent height in the first direction and a corresponding apparent width in the second direction of a reflection 9 or cluster with the aid of the measurement distance 43.

In addition to these geometrical considerations, in addition an intensity of the reflection 9 can also be determined, which can also be incorporated into observations. In this case, for example, a location of the position of the reflection 9 can be ascertained on the basis of a maximum, barycenter, or another evaluation function of the intensity of the reflection 9, in first location, second location, and/or distance. Using the intensity of the reflection 9, especially in combination with the other above-mentioned analyses, a reflectance of the reflective object 10 can also be ascertained as already described, which can represent a further criterion for differentiating the reflections 9a, 9b, 9c, 9d and also especially for classifying the object 10 triggering the reflection 9, especially for differentiating a surveying reflector 10 from an interference reflection 9c, 9d or for automatically selecting a specific reflector type. The reflectance is illustrated here by patterns of different brightness of the reflections 9a, 9b, 9c, 9d. The ascertained items of information with respect to position and/or extension can optionally also be taken into consideration in addition in the classification of the objects 10.

In the example shown, in this case the reflections 9a and 9b may be recognized as geometrically coherent (=cluster)—and thus originating from a single reflection object—on the basis of the location thereof in distance 43, first direction 41, and the proximity thereof in the emission fans 13a and 13b in the second direction 42. Jointly with the high reflectance thereof (and/or the small geometrical extension of the reflection), in this case this is a surveying triple prism 10 (at least with very high probability). This surveying triple prism 10 is thus in the distance 43 associated with the reflection 9a, 9b, of the first direction determined for this reflection 9a, 9b and for this distance on the basis of the analysis of the blurry imaging of a plurality of pixels of the detector. In the second direction 42, the object 10 is to be located in the direction of the emission fan 13a, since the reception signal for this reflection already becomes weaker again in the emission fan 13b and has thus already exceeded its maximum. Alternatively, the second direction 42 could also be interpolated between the emission fans, in particular with respect to the determined intensity—especially upon use of emission fans which are comparatively narrow in the second direction 42, however, in such a way it is often not necessary to determine a sufficiently accurate location in the second direction as a transfer value for a subsequent fine targeting of the object 10 using the surveying device. This at least rough location of the position of the surveying reflector 10 ascertained by the target search device can then, for example, be transferred automatically to an automatic targeting device of the surveying device, which then automatically (exactly) targets it, surveys it, and provides its geodetic coordinates.

In one embodiment according to the invention, in this case the analysis can especially be performed on the basis of the distance 43, the location in the first direction 41 (=vertical angle), and the intensity (and/or the reflectance derived therefrom) of the reflection, in particular since all of these items of information are ascertained directly from the output signals of the SPAD array pixels 1 of the position-resolving detector 11 according to the invention. A rapid and optionally also at least partially parallel analysis of the pixel signals for these items of information can thus be performed, and especially also the combination thereof can be carried out to recognize, differentiate, and classify targets—preferably online, i.e., just-in-time for each of the fans directly upon reception of the reflection signals. A primary analysis in a distance (=time), vertical angle, intensity, space, or diagram can thus more or less be carried out. The horizontal angle of the second direction 42 can then first be incorporated after completion of the above analysis, wherein the second direction 42 can also be supplied by the surveying device.

Figure 8A:
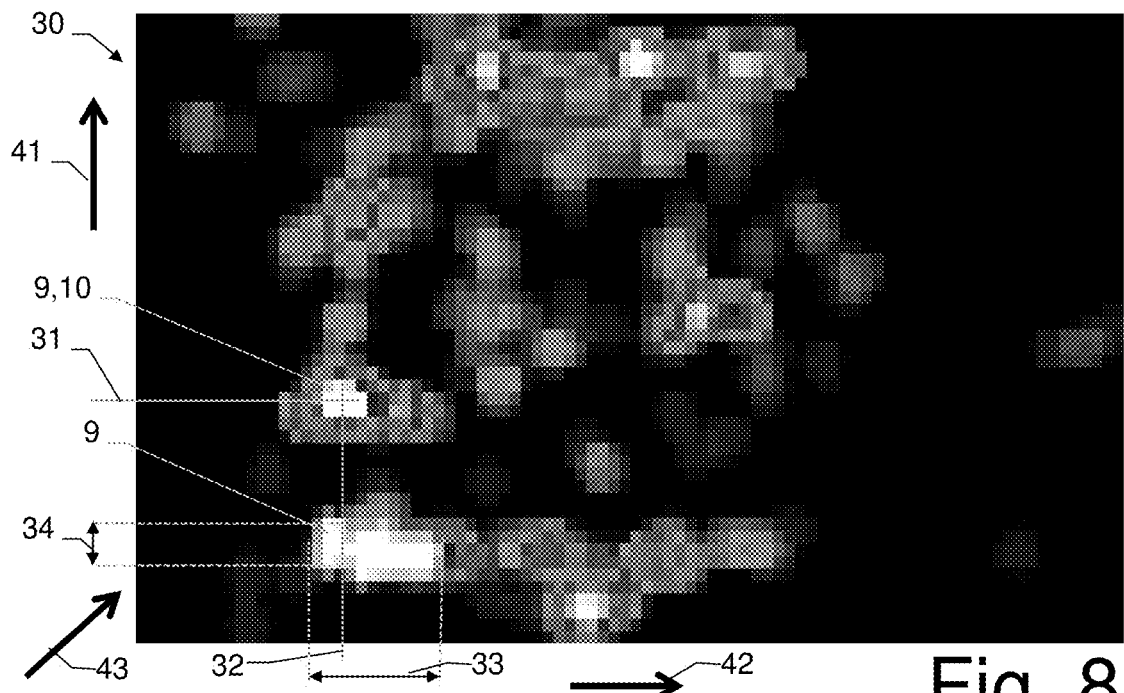
FIG. 8a and FIG. 8b each show an illustration of an example of an embodiment of an acquisition according to the invention during a target mark search.

In FIG. 8a, an example of an acquisition and analysis according to the invention during the target search is shown—in the scope of the limited possibilities here of a two-dimensional black-and-white illustration. In this case, the searched spatial region is shown more or less as a panoramic image 30. In this case, the resolution of the spatial region 22 is represented by the described analysis of the longitudinal direction of the detector 11 in the first direction 41 in the image 30 in the vertical direction, and the resolution of the spatial region 22 is represented by the adjacent emission fans 13a, 13b, . . . in the second direction 42 in the image 30 in the horizontal direction. In a non-orthogonal or non-levelled embodiment, the acquisition could if needed also be converted to the representation shown. In this case, the relatively low resolution in the form of the clearly recognizable individual grid (appearing square in this example, but generally not necessarily) of the image 30 obviously stands out. This low resolution may appear disadvantageous and inaccurate at first view, but, inter alia, enables faster scanning of the spatial region 22 than would be the case at higher resolutions. The grids represent the reception intensity in its brightness here, wherein lighter regions represent stronger reflections and black regions represent no reflections. In this case, however, the distance 43 associated respectively with the reflection 9 and ascertained by the distance measuring unit is preferably also to be taken into consideration, since, for example, only a comparatively weak reflection will be received even from a very bright reflector 9 at long distances 43. This can be performed, for example, by an analysis of a distance-scaled brightness of the reflector 10, or in other words by an analysis of a reflector-specific reflectivity in 3D space. The simplified 2D representation can be considered here to be solely by way of example and/or as an already distance-scaled 2D representation of the reflectivity or reflectance. Spatial regions from which reflections were received are thus shown in the form of image regions or clusters 9 represented as light. Such a cluster 9 can be defined, for example, as a spatially coherent region (i.e., not only in the two dimensions 41, 42 shown, but rather additionally also in the distance 43), in which a received reflection intensity and/or a reflectance ascertained in this direction is greater than a static or dynamically adapted threshold value.

According to the invention, one—or in the case of a multitarget case possibly also multiple—distances are ascertained for each reflection 9 region shown as light using the distance measuring unit, whereby the illustration 30 shown actually would also have a spatial depth, which may not be reasonably represented here, however. The light regions would thus also be staggered into the plane of the sheet in this case. Therefore, for example, a region only visible here as a single cluster 9 could also result in multiple depth-staggered spatial clusters in the distance 43, which are each to be considered as an independent cluster as such. For example, in the case of a reflective glass pane in the background of a measurement reflector or the like.

Furthermore, on the basis of the measured extension 33 and/or 34 of a reflection 9 in one or over multiple emission fans, and also with incorporation of the respective associated distance 43, an actual width 33 and/or height 34 of the target reflectors 10 can be ascertained. For example, on the basis of the geometrical relationships known in this case, a width and/or height (or a geometrical extension of the target reflector in general location) can also be computed or at least estimated in specific measurement units. Such a width and/or height are often characteristic features of the target objects to be located and represent relevant measured variables in the target mark recognition.

During the data analysis, the depth staggering of the reflectors 10 and the interference reflections 9 is preferably taken into consideration. The distance measuring unit, especially if it is formed as a waveform digitizer (WFD), already generically provides depth-staggered brightness values of the reception signals, for example, one brightness value in the form of a signal amplitude is acquired and provided per pixel over a time axis (which accordingly corresponds to the signal runtime of a distance axis). If brightness values of adjacent pixels have equal associated distance 43 in this case (thus have equivalent locations on the time axis), the location thereof in the first direction 41 (and/or in the second direction 42) can thus be interpolated between the pixels, and thus a reception direction (or location) of the reflection 9 in the first direction 41 can be ascertained. In the case of differing distances 43, it is to be presumed that the reflections 9 originate from different objects, so that an interpolation in the first direction 41 and/or second direction 42 is not expedient.

Furthermore, an associated reflectance can be ascertained in each case on the basis of the received reflection intensities to the target reflectors 10 or reflective objects, especially in consideration of the respective associated distance. On the basis of these data, the analysis unit can identify and/or classify reflection targets, in this case especially reflective foreign objects can be robustly differentiated from surveying targets, especially in consideration of respective characteristic reflectances. For the located reflectors, in this case in consideration of the intensity or brightness distribution, the location and thus the directions to the reflectors are determinable. All of these computations can be computed in this case by the analysis unit 27, preferably in real time during the scanning of the search space.

In one embodiment, in this case an objective and complete computation of a 2D or 3D intensity image—as shown in FIG. 8a to illustrate one embodiment variant of the analysis—can also be omitted in the target recognition. An embodiment having an analysis carried out essentially online during the acquisition can thus be formed. Similarly as also explained in conjunction with FIG. 8b, for example, for each of the emitted emission fans 13, a plurality of the time axes (or distance axes, respectively), which are each generated with a distance measuring unit associated with one of the pixels 1 for this emission fan 13, can be processed and analyzed. This analysis and computation are formed in this case in such a way that one or more signals of reflections 9A, 9B are located on the time axis. This can be performed continuously and from laser emission to laser emission, wherein corresponding signals are compared. In this case, especially the expected signal strength and simultaneously the target object width can be checked. Signal parameters of the received signals can be compared to one (of multiple) configured reflector models for correspondence in this case to find a target object 10. Multiple target objects can certainly be located in this case along the distance/time axis 43, which are differentiable according to the invention on the basis of the different distance information and/or reflectivity, for example, a reflector in front of a traffic sign, etc. On the basis of the majority of detector pixels 1, in this case the targets can also be located in the vertical direction, along the fan direction, and also spatially separated during the analysis in the case of multiple targets.

In other words, the 3D space is more or less successively scanned for reflectors in a fan-like manner, including depth acquisition, continuously analyzed by computer during this, and located target objects 10 are classified and stored. A user can optionally establish in this case which target classes or target types are to be located, stored, or approached. The performed analysis can then optionally also be visualized for a user, for example, the found target objects can be overlaid as an overlay in a camera image or the reflector targets can be marked on a tablet PC in a construction plan, a map, or a CAD model for the purpose of visualization. In one embodiment, such a 2D intensity image, or preferably a 3D intensity image, can also be provided to a local or remote user for visualization of a station overview and/or for interaction with a target selection unit, for example, on a display screen, but optionally also via an augmented-reality (AR) or virtual-reality (VR) display unit.

According to the invention, in this case the determination of a position or location 31 or location of a reflection 9 in the spatial region is carried out not only with an analysis of a single pixel 1, but rather the reception intensity of the pixels 1 located adjacent in the first and/or second direction is also considered. For example, an intensity barycenter or center point of a reflection 9, i.e., of a spatially coherent cluster 9 of multiple pixels 1, can be determined as position 31 of the reflection, whereby the position 31 ascertained in this case has a resolution which is greater than the pixel resolution of the acquired image 30. Therefore, with corresponding engineering design of the parameters of a target recognition system according to the invention, the position 31 of a target reflector 10 in the spatial region can be produced with sufficient accuracy that this reflector can be automatically targeted by the surveying device for subsequent surveying.

Special embodiments of the invention can in this case also provide additional functionalities for an improved recognition of target reflectors 10 and the differentiation thereof from interference reflections 9. In addition to the sensitivity advantages of the pixels 1 used according to the invention, which are each formed as an SPAD array (for example, with respect to sensitivity, overload behavior, time measurement properties, etc.), the reflection acquisition according to the invention—as is apparent from the illustration shown here—can also be determined as a two-dimensional extension 33, 34 of the reflection 9 (and/or if needed also as a three-dimensional extension of the reflection 9 in consideration of the distance 43, which unfortunately cannot be represented here). Inferences can thus be computed about a probable type or class of reflection sources, for example, using a comparison of the cluster 9, 10 to a modeling of a reflection to be expected of a known target reflector in the corresponding distance of the cluster 9, 10, or using a correspond trained artificial intelligence system, neuronal network, rule-based classification, or a mixed form thereof. Thus, for example, an oblong reflection 9 of a reflector strip on a sign or a large-area but weakly reflecting glass pane 35 can be differentiated from a punctiform triple prism 10 reflecting at high intensity.

A classification is in this case, for example, on the basis of a reflectance determined by the device according to the invention of the object causing or triggering the reflection 9 with those which are known from the target objects 10 used in the surveying. Triple prisms in surveying have, for example—scaled to a scattering white surface—a reflectance of approximately 1 million, planar retroreflectors made of plastic (cat's eyes) have a reflectance of approximately 30,000, reflective films of approximately 1000, etc. The gradations of these reflectivities of the above examples thus comprise in this case at least approximately one order of magnitude or more, whereby these can be acquired, resolved with sufficient accuracy, and also differentiated using the SPAD arrays used according to the invention. A reliable classification of the reflective markings and reflective targets typically used in surveying and in construction can therefore be carried out on the basis of the reflectances thus ascertained.

In the example shown in FIG. 8a, in addition to diverse interference reflections, inter alia, for example, a surveying reflector 10 on a surveyor's rod and the warning vest 9 of the worker holding the surveyor's rod can be seen.

For a recognition of triple prisms, in one embodiment especially also a parallax adapted to the dimension of the triple prism used between emission and reception fans in the target search unit can be used in this case. The signal of targets, the reflection of which is incident with a parallel offset in the receiver—which parallel offset essentially corresponds to the parallax typical in these triple prisms—is heightened in relation to other targets typically reflecting without parallax. With correspondingly formed embodiments of the devices having such parallax between emission axis and reception axis, for example, simple reflective objects can only overcome the sensor parallax from approximately 20 m and generate a reception signal at all. Retroreflectors having beam offset, in contrast, overcome the parallax at all distances. Especially together with the significantly higher reflectances of triple prisms in contrast to interference reflections and/or the specific point shape thereof in contrast to often larger-area interference reflections, the analysis unit can thus also carry out a robust, automatic specific recognition of surveying reflectors in the associated first and second directions thereof, and also ascertain the distance thereof.

With multiple repeated scans of the spatial region, in addition mechanical dithering can occur, for example, in the form of a geometrical offset of the emitted fans in the second direction in a location between two of the fans emitted during the prior pass and/or an offset of the acquisition regions of the pixels in relation to the prior pass in the first direction—whereby the achievable resolution may be further improved. For this purpose, for example, the movement axes of the surveying device and/or the emission points in time of the light fans can be controlled accordingly. For example, this can be performed, inter alia, after a first rough scan of the entire spatial region for a portion of potential interest of the entire spatial region.

In modern geodetic surveying devices, such as total stations, theodolites, tachymeters, or laser trackers, the movement in the second direction 42 can usually take place at quite high speed, for example, a pivot around the standing axis at up to 120°/second. A target search device according to the invention therefore has to have a correspond high laser firing rate and also a correspondingly high measurement rate on the reception side when emitting the emission fan to also be able to use these speeds and in this case be able to scan the second direction continuously—or also with multiple overlaps—for surveying targets using the light fans. For example, an assumed measurement rate of 75 kHz divides a horizontal search region of 360° into sectors of the width 0.0016°. Using a typical width of the laser fan assumed here in the second direction of 0.013°, each reflection point 9 can thus be measured approximately 8 times. In one embodiment of the invention, these and even higher scanning speeds and analyses can certainly be processed in real-time using current analysis means. However, in order to save electric power and current and/or avoid excessive heat development of the electronic processing unit—especially, for example, with battery-operated instruments—optionally or alternatively the above-described method of mechanical dithering using repeated scans can be used, a measurement rate aperiodic with respect to a revolution can be used, or first a rough scan at a lower measurement rate (for example, for approximately 1-fold coverage of the scanning region) followed by a measurement—in particular only focused on potential target reflectors recognized in this case—at higher measurement rate.

Figure 8B:
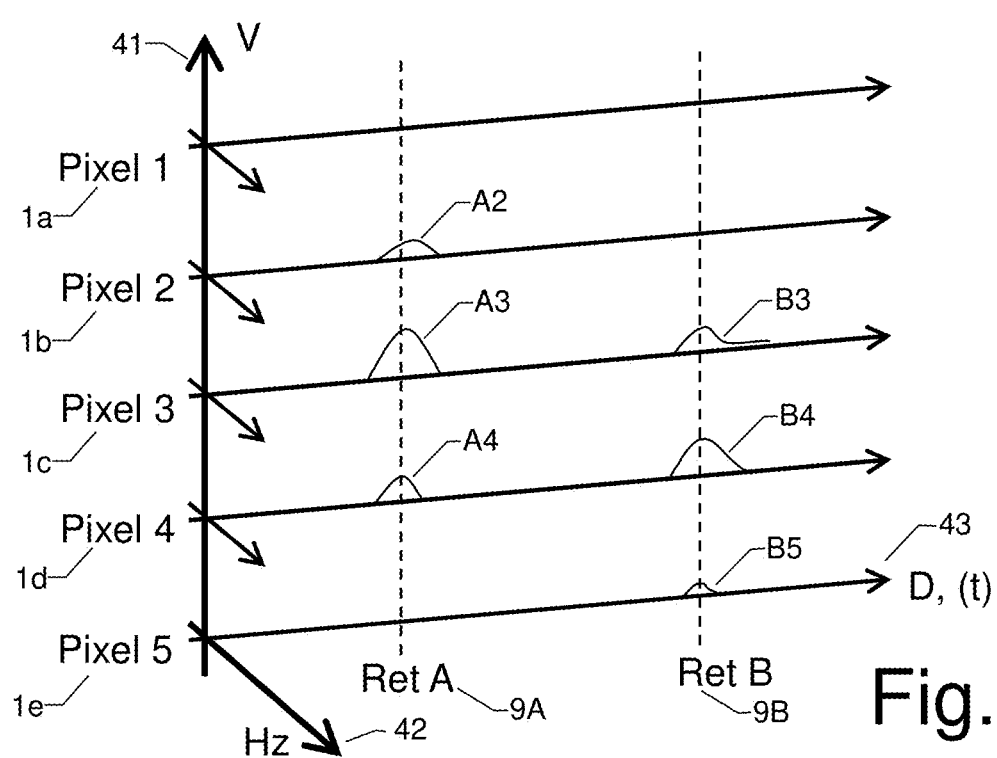

A diagram having exemplary reception signals of a target reflector search device 14s according to the invention is shown in FIG. 8b. Therein, multiple, by way of example five here, SPAD array pixels 1a-e of the linear arrangement of the position-resolving detector 11 are plotted, which are arranged here in a vertical direction V (as the first direction 41, in which the emission fan 13 is aligned) in the image region of the imaging optical unit 4. A time axis 43 $D_r(t)$ is associated with each of these pixels 1a-e in this case, along which, for each of the pixels 1a-e, in each case the received light intensity of possible reflections 10 of an emission fan light pulse emitted in this Hz direction 42 is plotted. The time axis $D_r(t)$ 43 is in this case, in accordance with the signal runtime of the light pulse plotted thereon, also simultaneously to be considered a distance axis as a measure of a distance to the position of the reflection 10 proportional to the runtime. The second direction 42 is indicated in this case as a horizontal axis with Hz, in which the emission fan 13 is moved between the light pulses of the individual emission light fans. With each laser pulse, in this case a diagram as shown results at new Hz angle 42, having the dimensions distance D 43 & V angle 41. For the sake of clarity, only one diagram for one of the emission fans 13 of this emission fan family is shown in the Hz direction 42 here, however. In this case, the time axis $D_r(t)$ 43 is also to be considered in accordance with the signal runtime of the light pulse plotted thereon as a distance axis, on which a measure of a distance, proportional to the runtime, to a position of the reflection 9 is plotted. The curves shown of the reflections 9a and 9b on the time axes $D_r(t)$ 43 of the individual pixels 1a-e can be acquired in this case using an analog-to-digital converter at the output signal of the respective pixel 1 as a waveform of the reception intensity over time.

It can be seen in this case that, in accordance with the blurry imaging according to the invention, according to the invention the acquisition regions of the individual pixels 1a-e partially overlap in the object space, so that a reflection 9a, 9b from a location in the object space is (at least proportionally) received by more than one of the pixels 1a-1e. In the example shown, two reflections 9a and 9b occur, which have the same location Hz in the second direction 42 here—since they belong to the same emission fan 13—but have both a different vertical location V in the first direction 41 and also a different distance D 43.

In this case, in one embodiment of the analysis, it can be presumed that intensity pulses A,B at different pixels 1a-e, which have (at least substantially or essentially) the same location on the time axis $D_r(t)$ 43, originate from the same reflection source 10. Therefore, in the example shown, the pulses A2, A3, A4 can be evaluated together, wherein a location of the reflection source in the V direction 41 is ascertainable on the basis of a distribution of the intensities (i.e., for example, the level of the pulses) of the pulses A2, A3, A4 occurring at this point in time at the pixels 2, 3, 4.

Therefore, the V location 41 of the reflection source of the reflection 9A is ascertained with a resolution which can also be between the pixels 1*a-e* (and/or the associated optical axes thereof), whereby an association of the location of the reflection source with a single one of the pixels does not solely take place, but rather a resolution of the location of the reflection source in the direction V 41 is achievable, which exceeds the number of the pixels 1*a-e*.

In the example shown, a second reflection 9B furthermore occurs at a distance RetB different from the above-mentioned distance RetA. This is also acquired according to the invention by a plurality of the pixels 1*a-e*, wherein the analysis thereof not only results in a different distance D 43, but rather also a different location in the direction V 41—in this case between the pixels 1*c*, 1*d*, and 1*e*, especially a V location between the pixels 1*c*-1*e* which is approximately at one-fourth of the distance between the direction of pixel 1*d* in the direction of pixel 1*c*. This analysis was already explained above.

It is to be noted here with respect to the location Hz in the second direction 42 that it does not necessarily have to be identical in its final analysis for the reflections RetA, RetB shown, but rather that the pulses A2, A3, A4 B3, B4, B5 shown can in any case also be distributed over multiple Hz diagrams of multiple emission fans 13 in the second direction 42, and the final location of the reflection in the second direction 42 is ascertained, as already explained, on the basis of a barycenter, peak value, or the like of the received intensity over multiple emission fans—so that in any case an intermediate position between two emission fans 13 can also be ascertained in the direction Hz 42.

In one embodiment, the diagram in FIG. 8*b* can also be considered as a side view or as a section orthogonal to the plane of the drawing of FIG. 8*a*. In this case, the V axis 41 and the Hz axis 42 correspond to the two image coordinates of FIG. 8*b* and the D,(t) axis 43 extends orthogonally to the plane of the sheet. The heights of the waveforms A2, A3, A4 and B3, B4, B5 of the reflections 9*a*, 9B from FIG. 8*b* are represented in this case by corresponding brightnesses of the pixels in FIG. 8*a* (wherein in the embodiments shown here, the number of the pixels 1 of the detector 11 is not equal in the different examples of FIG. 8*a* and FIG. 8*b*).

FIG. 9 shows a block diagram of an embodiment of a method according to the invention or a process according to the invention, especially to be executed automatically during targeting of target objects, for example, in a geodetic surveying device.

In block 50, an emission of an emission fan of optical radiation is performed, preferably in the form of a time-modulated, in particular pulsed projection of a laser line.

In block 51, a movement of the emission fan is performed in different directions over a spatial region to be searched, in particular a rotation of the emission fan around an axis, so that the spatial region is covered by a fan bundle thus resulting.

In block 52, a reception of a reflection of one of the emission fans is performed in a fan-shaped reception region. Using an imaging optical unit, in this case a projection of the reception region is performed on a position-resolving optical detector, which is formed using a linear arrangement of a plurality of pixels each formed as SPAD arrays. The projection is performed in this case using an optical system which is formed in such a way that blurry imaging of the object space, which is expanded in relation to a focused image, is performed on the position-resolving optical detector—especially wherein the reflection of light of the emission fan on reflective objects in the object space is acquired by more than one of the pixels.

In block 53, a determination of a distance, a signal strength, and a position of the reflection is performed on the basis of the direction of the emission fan in the spatial region using an analysis of the position-resolving optical detector, wherein the position is performed using a determination of a location of an intensity-barycenter (or center of gravity or centroid) of the blurry image of the reflection on the detector over a plurality of the pixels. In this case, especially a runtime distance measuring unit can be formed for determining the one distance for each of the reflections, preferably respectively individually for each of the pixels. The direction of the emission fan in the spatial region can be acquired using an angle encoder as the second direction. In particular, a reflectance of the source of the reflection can be determined in this case on the basis of the signal strength and the distance.

The above steps can especially be performed continuously or quasi-continuously in this case, in any case also at least partially in parallel—in particular for each of the emission fans.

In a further step, the ascertained values can be relayed to the surveying device—especially a location—rough in the geodetic scale—of the object, which triggers the reflection in the first direction, the second direction, and the distance. In this case, a recognition, classification, and/or filtering of the objects can preferably be performed, for example, on the basis of the reflectance, geometrical dimension, etc. thereof. In particular, on the basis of this ascertained position of the target object, the surveying device can approach this position using a high-precision automatic target acquisition device and as a result automatically ascertain the coordinates of the target object with geodetic accuracy, i.e., in particular accuracy to seconds of an angle and millimeters, and provide them as the surveying result.

In one example of an embodiment of an application of the first aspect of the present invention, for example, the target search unit can ascertain rough coordinates (in the geodetic scale) for the searched target objects, for example, a rough direction in the first and second directions, for example as two angles Hz and V in the coordinate system of the surveying device. This is performed by means of a distance measuring unit which is formed to receive transient signals of the emitting unit and ascertain at least one amplitude (intensity) and a runtime for a reflection from a target. The amplitude can be converted in this case into a reflectivity, as a target property, and can be compared, for example, to a threshold value preconfigured for a searched reflector target.

In this case, more than one reflection can certainly also occur on the distance and/or time axis for one of the pixels, which reflections are well separated, however, using a distance measuring unit of the target search device, which measures at least to approximately 1 to 5 cm accuracy, in the reception signal and are accordingly separable from one another during the analysis on the basis of the location thereof on the time axis. In one embodiment, for example, the amplitudes of the incident reflections can be measured continuously, i.e., for each of the emission fans emitted in a different second direction or from laser emission to laser emission. In this case, in a simply designed embodiment, for example, an angular position of the movement of the emission fan in the second direction can be acquired, at which the intensity of a reflection decreases again after an increase—which represents only one example for ascertaining a maximum of the reflection in the second direction of a pivot of the emission fan. In this case, as a further criterion moreover a predetermined requirement for the reflectivity ascertained for this reflection can be used as a condition for an acquisition of this reflection as a target. In the case of such an acquisition of a reflection of a target, the surveying instrument can then fix this angle, i.e., stop the movement of the axis system in the second direction and align the target axis of the surveying device on the target thus found.

Using the multiple pixels of the position-resolving linear detector, which are provided in the first direction, for example, the vertical direction, according to the invention, in particular in combination with multiple distance measuring units each associated with one pixel and operating in parallel—as described—an at least roughly resolved alignment in the first direction along the emission fan is also ascertainable. Therefore, for example, an angle coordinate of the reflection in the vertical direction can be ascertained, for example, from a set angle on the first axis system of the surveying instrument supporting the target acquisition unit and the deposition measured by the target acquisition unit, which is ascertained via the irradiated pixels as described. The surveying device can then roughly align its two axis systems on the target thus found, or its coordinates in the first and second directions, respectively, and survey this target, for example, by the control being transferred to an automatic target recognition (ATR) of the surveying device.

FIG. 10 schematically shows a surveying device 101, e.g. a theodolite or a total station, with an automatic target marker locator 102 and two target markers 103 and 105, with which target points can be marked in the measuring environment, e.g. for geodetic surveying purposes. In the example, the target markers 103, 105 have retro-reflectors 113 for this purpose, which can be sighted and measured by the surveying device 101 using a measuring beam which is not shown, so that the direction (based on the sighting direction) and distance (e.g. by time-of-flight or phase difference measurement) to the retro-reflector 123 and thus to the target can be determined with high accuracy.

To perform the measurement, the measuring beam must first be aligned to the target marker 103, 105, i.e. the latter must be located. This can be carried out manually by a user, which is relatively time-consuming, or in some prior-art surveying devices automatically, e.g. using large-area illumination with target seeking radiation and detection thereof with an optical imaging unit with a large field of view. The optical imaging unit is designed as a camera, for example, which is either fixed relative to a telescope of the surveying device 101 or is pivotable freely about one or two axes, wherein the relative angles between the viewing direction of the camera and the telescope are measured. The central issue here is that associated offset angles with respect to the viewing direction of the telescope can be calculated for each pixel of the camera.

One of the problems with this approach is that when multiple target markers 103, 105 are present in the measuring environment, as shown, the surveying device 101 cannot distinguish which target marker 103 or 105 has been located. In addition, under certain circumstances it is also possible that extraneous light sources 120, which emit extraneous radiation 121, are incorrectly registered as a target marker. Thus, with prior-art methods confusion arises, which causes measured points to be assigned incorrectly, for example. Although techniques for the unambiguous identification of target markers 103, 105 are known from the prior art, these are not sufficiently robust and/or require disproportionate additional effort.

The second aspect of the present invention proposes a method in which a respective target marker 103, 105 emits target marker radiation 104a, 106a, which is modulated in such a manner that it repeatedly exhibits a signature 104, 106 characteristic of the respective active target marker 103, 105, wherein a phase-coded signature 104, 106 is advantageously used in each case to minimize the effect of amplitude fluctuation and/or radiation interruptions. For this purpose, a respective target marker 103, 105, as shown, has e.g. a light source 122, for example a high-power LED with a wide emission angle. The wavelength of the target-marker radiation 104s, 106s is preferably in the near-infrared range, e.g. it is 850 nm. The emission of the target-marker radiation 104s, 106s is started at the target marker 103, 105 by a user or by remote control, e.g. from the surveying device 101, i.e. by an external communication signal for the target marker 103, 105.

The target marker locator 102 is designed according to the invention in such a manner that ambient radiation is detected by means of a spatially-resolving optoelectronic sensor and an evaluation unit (not shown here). In the example of one embodiment, for example, a commercially available camera chip 112 (e.g. with a CCD or CMOS-matrix image sensor) can be used (or an RGB camera sensitive to NIR, if applicable), which provides a resolution of approximately 1.4 µm/pixel with approx. 10 megapixels and a field of view of approx. 4 mm by 5 mm. A target-seeking camera according to the invention is therefore e.g. a fast CCD or CMOS camera with or without a (modified) Bayer mask. Alternatively, the sensor is designed as a two-dimensional photodetector array or as a Dynamic Vision Sensor (event-based camera). As an alternative to the illustration, the target marker locator is a separate or separable unit.

Optionally, the target marker locator 102 or a camera of the target marker locator 102 has a long-pass filter that can be switched off. As an additional option, the device 102 has a near-infrared corrected lens. Also, a target marker location camera can be an overview camera, e.g. the same overview camera as is already available in some prior-art surveying devices 101 anyway. As a further option, in addition to the signature 104, 106 the target-marker radiation 104s, 106s also contains useful data (e.g. information about the target marker or sensor data), which can be read out by the surveying device 101. In other words, the radiation 104s, 106s can be used for data transmission in addition to the identification by means of a signature.

Radiation detected by the sensor is evaluated in such a way, e.g. by means of an image processing system or evaluation electronics, that a respective target-marker radiation 104s, 106s is reliably detected by means of the unique signature 104, 106 known to the evaluation unit, and thus the target-marker radiation 104s, 106s or target marker 103, 105 is reliably identified and thus also, for example, extraneous light radiation 121 or a foreign object 120 is reliably rejected. The method according to the invention will be explained in further detail by way of example by reference to the following figures.

Figure 11:
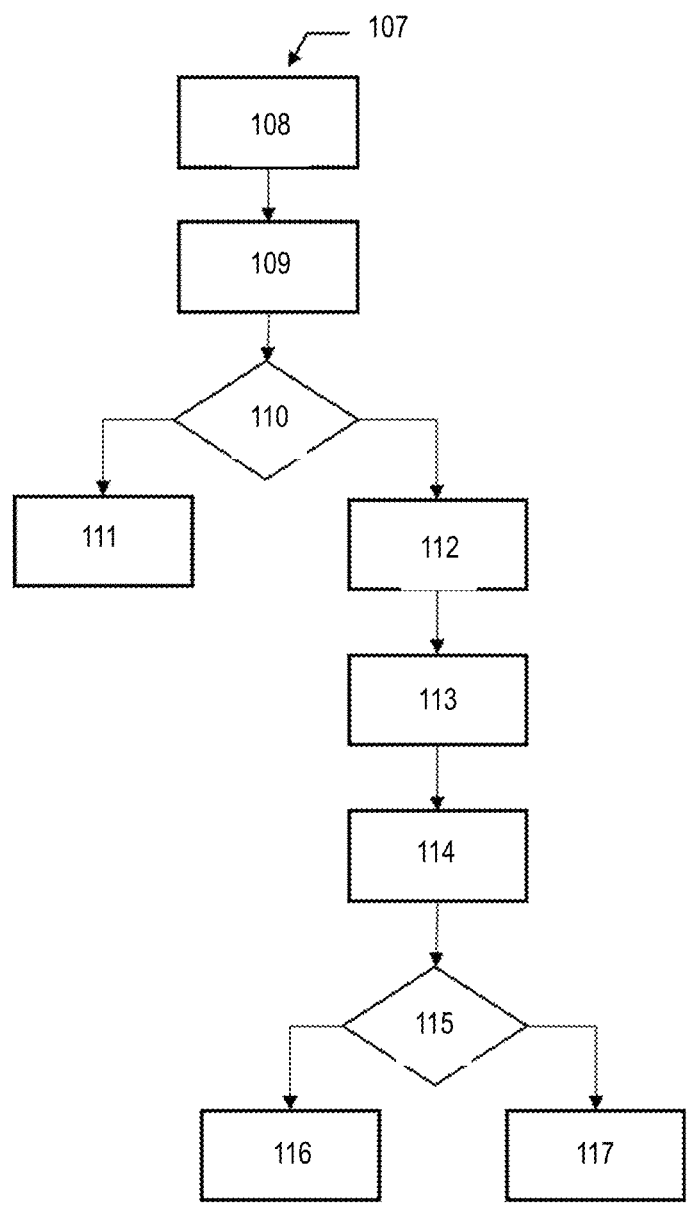
FIG. 11 shows an example of a sequence of a target location method according to the invention.

FIG. 11 shows an example of a sequence of the method 107 for locating a target marker 103, 105 on the basis of its radiation 104s, 106s or, more precisely, on the basis of the unique signature 104, 106 transmitted therewith (see FIG. 10).

In step 108, a first series of images is recorded, which takes place at a first frame rate. For example, the first frame rate is 45 or 65 Hz, which is advantageous in terms of target-marker radiation that is generated by mains-powered light sources. Preferably, the first frame rate and signature of the target marker radiation are tailored to each other by matching the modulation rate of the radiation to the first frame rate. Preferably, the recording of the first series of images takes long enough to ensure that the recurrently emitted signature is also detected multiple times/repeatedly. The following target marker location becomes more robust by multiple detection of the signal sequence.

Images from the first image sequence are analyzed in step 109. In this first evaluation stage, a statistical evaluation of pixels is carried out, wherein a quality function is determined with regard to a given known signature of the target marker radiation. The value of the quality function for a particular pixel indicates a probability that target-marker radiation is detected with this pixel. Thus, in step 110, a statistical test is performed on the basis of a plurality of consecutively recorded images to determine whether one or which pixel(s) has/have a signal characteristic corresponding to the stored signature. In the example, symbol 111 represents pixels that are unlikely to have detected target-marker radiation, and symbol 112 represents pixels for which the test result or the quality function value suggests that the temporal profile of the pixel signal is produced by the signature, and thus target-marker radiation is detected with them.

In this case, a relatively high degree of uncertainty is preferably permitted at this first test stage 110, i.e. such pixels which have tested positive with a probability of 50%, for example, are also permitted in the target-marker radiation class 112. The primary objective of this evaluation stage is that no target-marker radiation is "lost". The quality threshold is therefore chosen to be low, so that all target markers in the measuring environment are detected. In this step, it is accepted that some artifacts, e.g. interference radiation 121 (see FIG. 10), will possibly also be incorrectly tested as "positive", i.e. pixels will be identified as detecting target-marker radiation although this is actually not the case.

In order to classify the target markers robustly, i.e. to exclude artifacts classified as possible target markers, in step 113 a further image series is recorded with a different frame rate, preferably with a considerably higher frame rate (e.g. 10 times the first frame rate and/or in the range of several kilohertz). Here also, the frame rate and signature are preferably tailored to each other, for which the signature, for example, has a component tailored to the first frame rate and a component tailored to the second signature.

Afterwards, an evaluation (step 114) of intensity signals of the second image sequence is performed (at least) for those pixels that are identified as target marker pixels in the first evaluation stage. In step 115, the intensity signal of the pixel is checked for correspondence with a stored signature and if the evaluation is positive, it is confirmed (field 117) that the pixel has actually detected target-marker radiation and the corresponding target marker is thus identified and located. Otherwise, the pixel is classified as an artifact or discarded (field 116). A preferably high frame rate of several hundred or thousand hertz enables a detailed intensity signal to be created, so that in the second test 115 radiation signature can be distinguished from non-signature with high certainty.

It is advantageous that due to the first test stage 110 the recording of the second image sequence is able to be limited to the identified pixels. This means that the pixels that are considered as potential "target-marker radiation candidates", which are determined in the first part of the method, are optionally used as a (center of a) region of interest for which (and only for which) the second image series is then recorded.

The images from the second image sequence are recorded with a narrowed field of view, which is smaller than the first field of view of the first image sequence (the first field of view is preferably the maximum field of view of the image sensor or target locator, e.g. 5 megapixels, to ensure that the largest possible area of the environment is covered and/or that all existing target markers are detected as far as possible). The position of the second field of view depends on a particular pixel selected on the basis of the first series of images. The identified pixels thus specify, for example, where in the image the segment is located (compared to the first images). The segment can be limited to the identified pixel or pixels, or else a pixel region around such pixels is recorded, e.g. a region (or region of interest) of 20×20 pixels.

The advantage of such a small second field of view is that it results in considerably less data compared to a full image. This enables faster processing and/or the frame rate for the second image series can be increased even further, which can be advantageous for robust detection of the target-marker radiation. For example, with regard to tailoring the modulation rate and frame rate, signatures can be implemented with "high" modulation, which enable more robust identification of signatures.

Figure 12A:
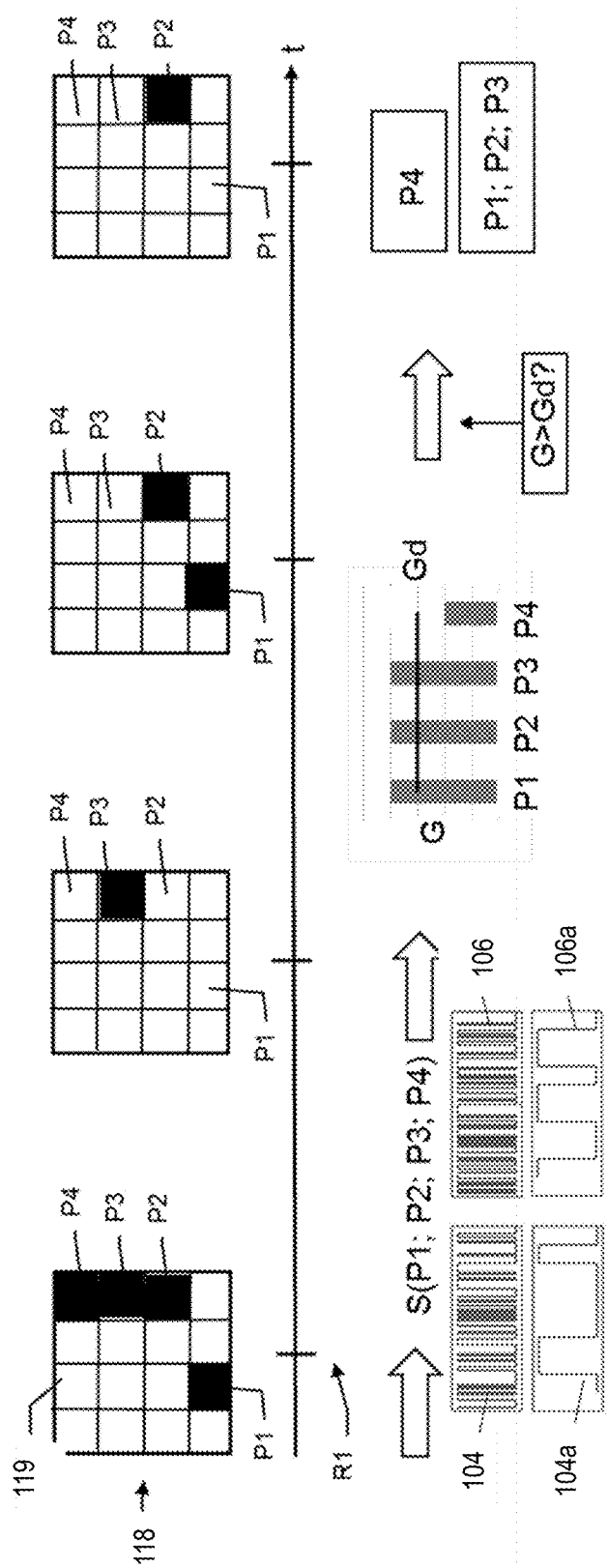
FIGS. 12a, 12b and 12c show a further exemplary representation of a target location method according to the invention.
Figure 12B:
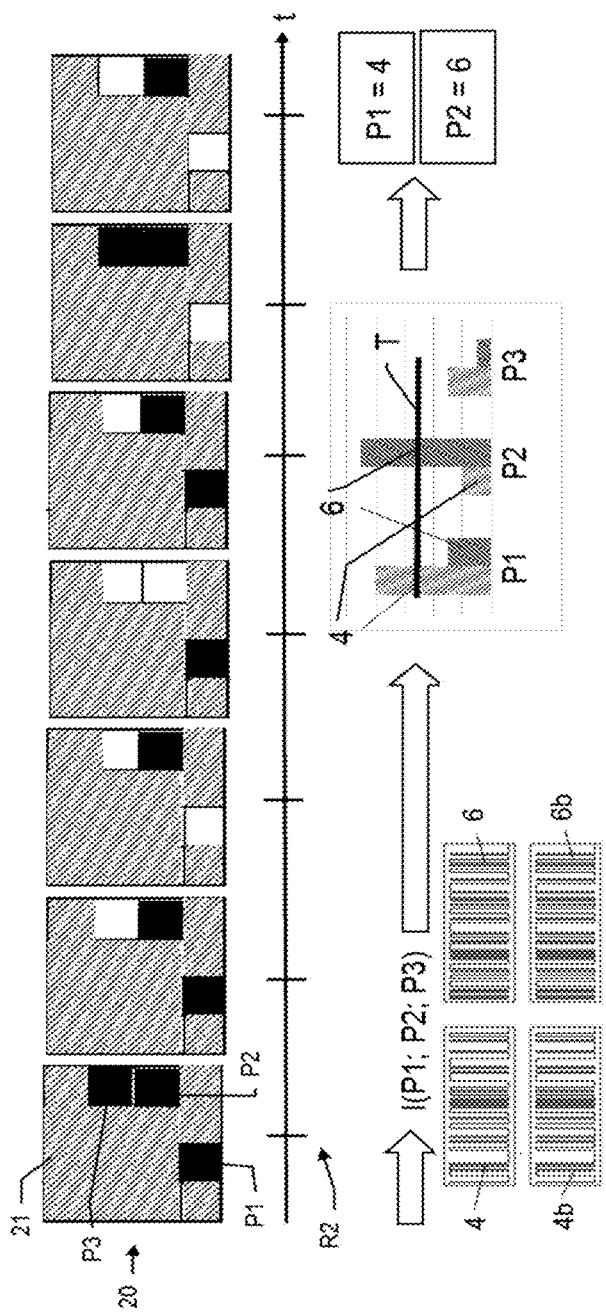
Figure 12C:
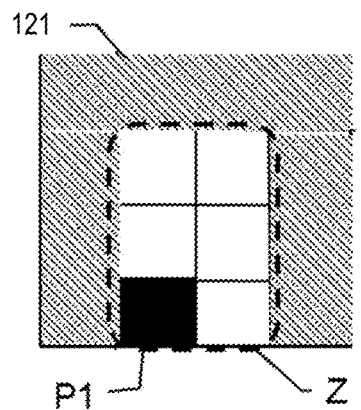

FIGS. 12a-12c show a further exemplary representation of a target location method according to the invention.

FIG. 12a shows a first image sequence 118 created at a first frame rate R1 along a time axis t, the individual images 119 in the example being difference images, which are created pixel-by-pixel from two or more consecutively recorded images in each case.

In the first difference images 119, which are produced by forming the difference between the images recorded with the image sensor, four pixels P1-P4 are identified as examples, the signals S of which will be examined in greater detail (wherein a black-to-white change is intended to illustrate a difference). The remaining pixels in the example have also been exposed, but for the sake of simplicity it will be assumed that these other pixels do not show any changes at all during the period of the image series in question.

The lower part of FIG. 12a illustrates symbolically that the signals S of the pixels P1-P4 are analyzed with regard to the known signatures 104, 106, and a quality function G is derived for each pixel P1-P4. The quality function G is used to test whether a given pixel has (probably) detected target-marker radiation. In the example, to do so it is tested whether the quality function exceeds a defined threshold value Gd or not. In the example, the detected signal for pixel P4 does not have sufficient resemblance (similarity) with either of the two signatures and is therefore classified as an artifact. The other three pixels P1-P3, on the other hand, are classified into the class "target marker radiation" by virtue of their value of the quality function G and are identified as pixels P1-P3, which have (presumably) acquired target marker radiation. As already described above, the threshold for the class "target marker radiation" is set to a low value in order to reliably include any possible target marker radiation, and the classification is therefore considered as a "rough" or preliminary classification.

FIG. 12b illustrates how a second sequence of images 120 is created for the three pixel "candidates" P1-P3 which have entered the second "round", in the example again in the form of difference images 121. In this case, as shown by the hatching, the maximum field of view is not used, rather radiation is only detected selectively for the pixels P1-P3. The recording with a selectively restricted second field of view can be carried out sequentially for the individual pixels or regions of interest (i.e. first align field of view on/around pixel P1, then on pixel P2, etc.). The second frame rate R2 in this case is, as indicated, much higher than the first frame rate R1.

The intensity I derived from the difference images 121 for each individual pixel P1-P3 is then analyzed with regard to the signatures 104, 106 (shown in the lower part of FIG. 12b). In the example, a correspondence of the intensity I of pixel P1 with the signature 104 is determined and correspondence of the intensity I of pixel P2 with the signature 106 (value in each case above a defined threshold value T). P1 is therefore recognized as belonging to the signature 104 or the (total) signal of pixel P1 as being caused by the signature 104, and P2 is assigned to the signature 106 accordingly. Radiation of the target marker 103 is thus identified with the pixel P1 (cf. FIG. 1) and radiation of the target marker 105 with the pixel P2.

By contrast, for pixel P3 no correspondence of the intensity signal I with either of the two stored signatures 104 or 106 is determined (value with regard to both signature 104 and signature 106 below the threshold value T). Thus, with the second "finer" test stage, which is based on the second image sequence, this sensor signal of pixel P3 was able to be "weeded out" as an artifact.

FIGS. 12a, 12b thus represent a further example of the procedure according to the invention, in which a large field of view is first used to cover a broad measuring environment region and a "pre-test" with regard to target-marker radiation is carried out with comparatively few images 119, in order then to perform a robust targeted test on the remaining segments of the measuring environment with a high temporal coverage using a dense image sequence 120.

The use of difference images 121 while using a phase-coded signature 104, 106 has the advantage that an analysis with regard to target signature is thereby possible even without prior synchronization, wherein optionally a given signature 104, 106 has a start and/or end pointer which indicates the start and/or end of the signature, e.g. in the manner of so-called "framing bits". For example, it is thus not necessary that the recording of the first and/or second image sequence and the emission of the target-marker radiation or the signatures 104, 106 are started synchronously or, expressed more generally, the proposed method eliminates the need for complex communication between the target marker and the target marker locator. If, for example, the emission of the target-marker radiation is started manually as mentioned above, any communication at all between the target marker and the target marker locator can be omitted. In addition, it is thus possible to eliminate bit errors as a result of slightly different clock frequencies of the target marker and the receiver purely on the receiver side, without communication between the two.

As shown in FIGS. 12a and 12b at the bottom, according to the respective frame rate R1, R2 for the first test stage (FIG. 12a), the "low-frequency" component 104a, 106a of the signature 104, 106 is used primarily or exclusively for the test, whereas in the second test stage (FIG. 3b) the "high-frequency" component 104b, 106b of the signature 104, 106 is used.

As shown schematically in FIG. 12c, contrary to the greatly simplified representation of FIG. 12b, the second field of view Z is preferably not limited only to a pixel P1 identified using the first image sequence, but also comprises a region Z or a number of pixels around it. As shown in the example, the identified pixel P1 does not need to be located in the center of the region and the second field of view Z does not need to be square.

For example, in the case of moving target markers, the first image sequence is optionally used to determine a direction of motion and also speed for a respective detected radiation, and the position and size (shape) of the field of view is adjusted on the basis of these parameters. If, for example, the determined target marker speed is relatively high, the field of view is also set relatively large, if the radiation on the sensor is moving "upwards", the field of view around the pixel P1 is extended or shifted "upwards" as shown. Thus, the second field of view is optimally adjusted to the movement of the radiation source/target marker.

Figure 13:
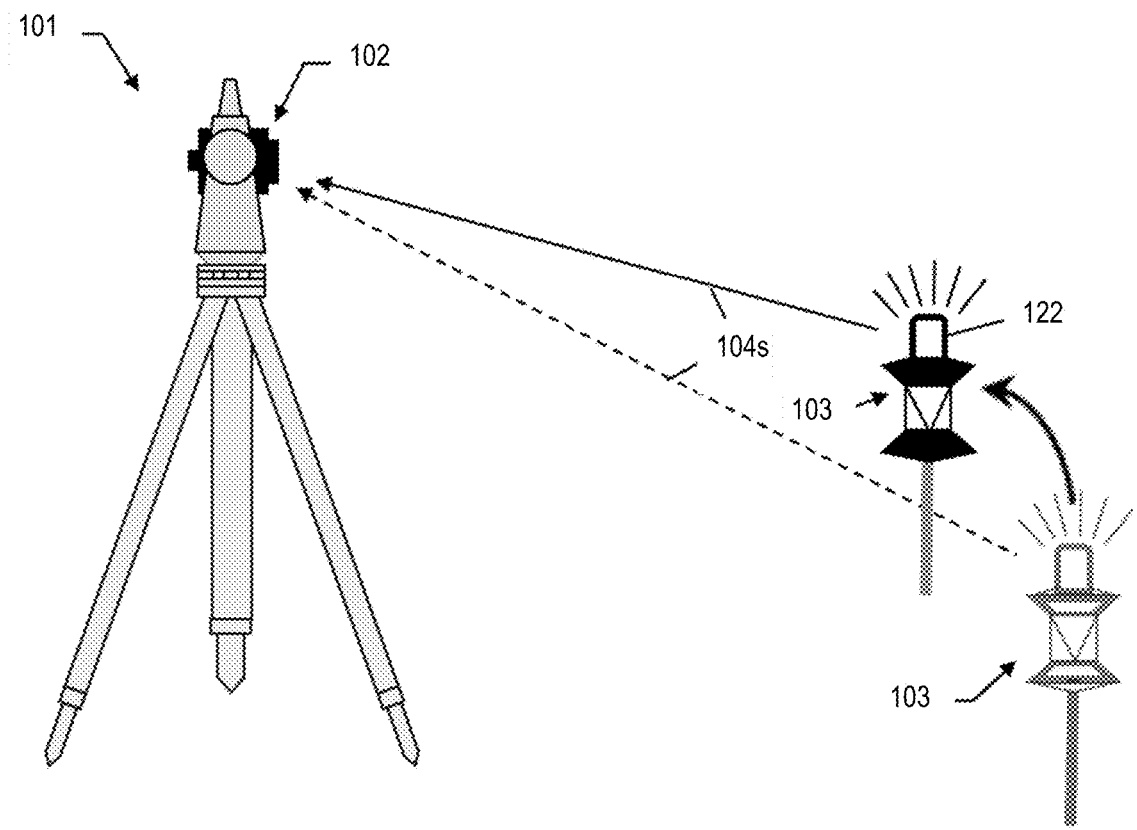
FIG. 13 shows a further extension of the target location method according to the invention.

FIG. 13 shows a further extension of the method. In the example, the position of those respective pixels which are clearly identified in step 117 (see FIG. 11) as pixels of a target marker 103 is used to determine a direction to the respective target marker 103, e.g. in the form of polar and azimuthal angles (wherein the direction can be determined not just after step 117, but also, for example, directly after the identification of potential target marker pixels; see step 12 in FIG. 11). For example, the evaluation unit of the surveying device 101 (see FIG. 10) is thus designed to determine a direction to the target marker based on the position of the identified pixel. This is optionally used to control, for example, based on a deviation of the pixel from a central pixel/sensor position (a zero point of the image sensor), an alignment of the target marker locator 102 or surveying device 101 in such a manner that the deviation is corrected. In other words, using the optionally determined direction to the target 103, the surveying device 101 can be aligned centrally to the target marker 103.

Alternatively or in addition, in the case of a moving target marker 103, the position or positions of the relevant pixel on the sensor is/are used to continuously track the moving target marker 103, wherein based on the temporal change of the pixel position, an (at least coarse) speed of the target marker, at least normal to the viewing direction, is also determined. The target locator 102 in these embodiments is therefore used not only for target location, but also for tracking the target marker 103. Especially in the case of a target locator 102 with a very large field of view (overview camera), it is also possible to track multiple target markers 103 at the same time, or to switch very quickly between the tracking of multiple target markers 103 even if they are moving in different directions.

The figures above represent only possible exemplary embodiments schematically. Unless otherwise noted, the different approaches can also be combined with each other as well as with known methods and devices.

The invention claimed is:

1. A method for automatically locating at least one target marker, comprising:
   emission of radiation by the target marker, wherein by means of modulation, the radiation recurrently has a characteristic signature;
   recording a first image sequence with a first frame rate;
   statistically evaluating the first image sequence by reference to the signature with determination of a quality function, wherein the value of the quality function specifies a probability that target marker radiation is detected in a respective pixel;
   identifying pixels with which target marker radiation is likely detected, based on the associated value of the quality function;
   recording a second image sequence with a second frame rate, different from the first frame rate;

evaluating intensity signals of the second image sequence for said identified pixels; and identifying the target marker radiation using the intensity signals on the basis of the signature.

2. The method of claim 1, wherein the recording of the second image sequence is carried out with at least one second field of view which is smaller than a first field of view of the recording of the first image sequence, wherein a position of the at least one second field of view corresponds to the respective identified pixel.

3. The method of claim 1, wherein the signature has at least one of:
- a first component adjusted to the first frame rate, and a second component adjusted to the second frame rate, and
- a start or end indicator.

4. The method of claim 1, wherein:
the second frame rate is at least ten times as high as the first frame rate, or
the first frame rate is in the range between 45 Hz and 65 Hz or the second frame rate is at least 1 kHz.

5. The method of claim 1, wherein:
the recording of the first and second image sequence is not synchronized with the emission of the target marker radiation or is synchronized via a separate, independent communication channel.

6. The method of claim 1, wherein:
the evaluation of the first or second image sequence is carried out by means of difference images; or
the recording of the first or second image sequence takes place over a period in which the emission of the signature is repeated multiple times.

7. The method of claim 1, wherein the quality function is dependent on the first frame rate.

8. The method of claim 1, wherein:
an automatic tracking of the target marker is carried out on the basis of the identified target marker radiation or by means of the first or second image sequence, on the basis of identified pixels a direction to the target marker is determined.

9. A target marker locator comprising:
a spatially-resolving optoelectronic sensor for detecting target marker radiation having a known characteristic signature, wherein the spatially-resolving optoelectronic records a first image sequence with a first frame rate and record a second image sequence with a second frame rate different from the first frame rate; and evaluation electronics configured to:
statistically evaluate the first image sequence, wherein a quality function is determined, the value of which indicates a probability that target marker radiation is detected in a respective pixel, for which purpose the signature is stored in the evaluation electronics,
based on the associated value of the quality function to identify pixels with which target marker radiation is likely detected,
evaluate intensity signals of the second image sequence for said identified pixels, and
to identify target marker radiation from the intensity signals based on the signature.

10. The target marker locator of claim 9, wherein the target marker locator has a long-pass filter that can be switched off, a near-infrared-corrected lens, or
the sensor is part of an overview camera.

11. The target marker locator of claim 9, wherein the evaluation electronics is further configured to determine a direction to the target marker based on a position of an identified pixel on the sensor.

12. The target marker locator of claim 9, further comprising a modulatable beam source for emitting target marker radiation, wherein the modulation of the modulatable beam source causes the target marker radiation to have a characteristic multi-level signature.

13. The target marker locator of claim 12, wherein the modulatable beam source is a near-infrared beam source.

14. The target marker locator of claim 12, wherein the modulation is phase modulation.

* * * * *